United States Patent
Chakravarty et al.

(10) Patent No.: US 6,519,499 B1
(45) Date of Patent: Feb. 11, 2003

(54) METHOD AND APPARATUS FOR EXTRACTING BRIDGES FROM AN INTEGRATED CIRCUIT LAYOUT

(75) Inventors: Sreejit Chakravarty, Mountain View, CA (US); Sujit T. Zachariah, Santa Clara, CA (US); Carl D. Roth, Santa Cruz, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/475,714

(22) Filed: Dec. 30, 1999

Related U.S. Application Data

(63) Continuation of application No. 09/442,119, filed on Nov. 17, 1999.

(51) Int. Cl.[7] ............................................. G06F 17/50
(52) U.S. Cl. ........................... 700/110; 700/121; 716/4
(58) Field of Search .............................. 716/4; 702/58; 700/109, 110, 121; 438/5, 10, 12, 14, 17, 18; 703/4

(56) References Cited

U.S. PATENT DOCUMENTS

| | | | |
|---|---|---|---|
| 6,044,208 A | * | 3/2000 | Papadopoulou et al. ...... 716/19 |
| 6,178,539 B1 | * | 1/2001 | Papadopoulou et al. ...... 716/11 |
| 6,317,859 B1 | * | 11/2001 | Papadopoulou ............. 700/110 |

OTHER PUBLICATIONS

Alvin Jee, David Dahle, Cyrus Baseghi and F. Joel Ferguson, Carafe User's "Manual Release Alpha.5," http://sctest.cse.ucsc.edu/carafe/user5.html, Date Jan. 24, 1996, 18 Pages.*

E.M. McCreight, "Efficient algorithms for Enumerating Intersecting Intervals and Rectangles," Report CSL–80–9, Xerox Palo Alto Research Center, Palo Alto, 1980.*

Alvin Jee, David Dahle, Cyrus Baseghi and F. Joel Ferguson, Carafe User's "Manual Release Alpha.5," http://sctest.cse.ucsc.edu/carafe/user5.html, Date Jan. 24, 1996, 18 pages.

F. Preparata, M.I.Shamos, "Computational Geometry An Introduction," Springer–Verlag, 1985, pp. 352–355.

F.M. Goncalves, I.C. Teixeria, J.P. Teixeira, "Integrated Approach for Circuit and Fault Extraction of VLSI Circuits," IEEE International Symposium on Defect and Fault Tolerance in VLSI Systems, Nov. 6–8, 1996, Boston Massachusetts, pp. 96–104.

(List continued on next page.)

*Primary Examiner*—Leo Picard
*Assistant Examiner*—Alexander Kosowski
(74) *Attorney, Agent, or Firm*—Cynthia T. Faatz

(57) ABSTRACT

A bridge fault extractor. A computer-implemented method for performing fault extraction from an integrated circuit layout in a two-net analysis mode includes determining maximum critical areas from the layout for a maximum defect size of a set of defect sizes to be analyzed wherein each maximum critical area corresponds to a net-name pair. The maximum critical areas are then locally merged by net-name pair to determine an area of a union of maximum critical areas for each net-name pair. Critical areas for defect sizes smaller than the maximum defect size are determined from the maximum critical areas and locally merged by net-name pair to determine an area of a union of critical areas for each net-name pair for each smaller defect size. In a multi-net analysis mode, overlap rectangles are determined by net-name pair. The overlap rectangles are then used to calculate critical areas for two-net and multi-net bridges for each defect size in a set of defect sizes to be analyzed. In one aspect, similar to the two-net analysis mode, overlap rectangles are first determined for the maximum defect size and are resized for smaller defect sizes.

26 Claims, 14 Drawing Sheets

OTHER PUBLICATIONS

F.M. Goncalves, I.C. Teixeira and J.P. Teixeira, "Realistic Fault Extraction for High–Quality Design and Test of VLSI Systems," IEEE International Symposium on Defect and Fault Tolerance in VLSI Systems, Oct. 20–22, 1997, pp. 29–37.

Pranab K. Nag and Wojciech Maly, "Hierarchical Extraction of Critical Area for Shorts in Very Large ICs," The IEEE International Workshop on Defect and Fault Tolerance in VLSI Systems, Nov. 13–15, 1995, pp. 27.

M. de Berg, M. van Kreveld, M. Overmars, O. Schwarzkopf, "Computational Geometry," pp. 209–217, Publisher: Springer.

F. Joel Ferguson, John P. Shen, Extraction and Simulation of Realistic CMOS Faults using Inductive Fault Analysis, IEEE International Test Conference, 1988, pp. 475–484.

Alvin Jee and F. Joel Ferguson, "Carafe: An Inductive Fault Analysis Tool for CMOS VLSI Circuits," IEEE VLSI Test Symposuim, 1992, pp. 92–98.

E.M. McCreight, "Efficient Algorithms for Enumerating Intersecting Intervals and Rectangles," Report CSL–80–9, Xerox Palo Alto Research Center, Palo Alto, 1980.

R.E. Tarjan, "Data Structures and Network Algorithms," Society for Industrial and Applied Mathematics, 1983.

John T. Chen, "Improved Usability of Contamination–Defect–Fault–Simulation," Carnegie Mellon University Thesis, 1998.

J. Khare, W. Maly, "Inductive Contamination Analysis (ICA) with SRAM Application," International Test Conference, 1995, pp. 552–560.

* cited by examiner

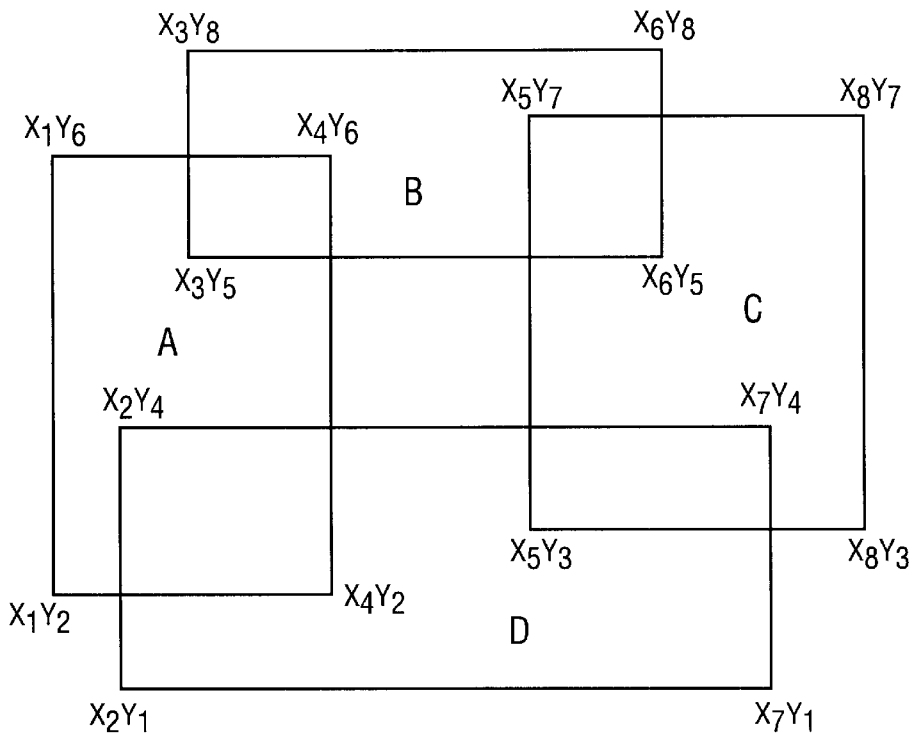

FIG. 6

| L | | $X_1$ | | $X_5$ |
|---|---|---|---|---|
| L[1]: | <$X_1,Y_2,I,B$> | M[1]:<$Y_6$, T> | | M[1]:<$Y_8$, T> |
| L[2]: | <$X_1,Y_6,I,T$> | M[2]:<$Y_2$, B> | | M[2]:<$Y_7$, T> |
| L[3]: | <$X_2,Y_1,I,B$> | $X_2$ | | M[3]:<$Y_5$, B> |
| L[4]: | <$X_2,Y_4,I,T$> | M[1]:<$Y_6$, T> | | M[4]:<$Y_4$, T> |
| L[5]: | <$X_3,Y_5,I,B$> | M[2]:<$Y_4$, T> | | M[5]:<$Y_3$, B> |
| L[6]: | <$X_3,Y_8,I,T$> | M[3]:<$Y_2$, B> | | M[6]:<$Y_1$, B> |
| L[7]: | <$X_4,Y_2,D,B$> | M[4]:<$Y_1$, B> | | $X_6$ |
| L[8]: | <$X_4,Y_6,D,T$> | $X_3$ | | M[1]:<$Y_7$, T> |
| L[9]: | <$X_5,Y_3,I,B$> | M[1]:<$Y_8$, T> | | M[2]:<$Y_4$, T> |
| L[10]: | <$X_5,Y_7,I,T$> | M[2]:<$Y_6$, T> | | M[3]:<$Y_3$, B> |
| L[11]: | <$X_6,Y_5,D,B$> | M[3]:<$Y_5$, B> | | M[4]:<$Y_1$, B> |
| L[12]: | <$X_6,Y_8,D,T$> | M[4]:<$Y_4$, T> | | $X_7$ |
| L[13]: | <$X_7,Y_1,D,B$> | M[5]:<$Y_2$, B> | | M[1]:<$Y_7$, T> |
| L[14]: | <$X_7,Y_4,D,T$> | M[6]:<$Y_1$, B> | | M[2]:<$Y_3$, B> |
| L[15]: | <$X_8,Y_3,D,B$> | $X_4$ | | |
| L[16]: | <$X_8,Y_7,D,T$> | M[1]:<$Y_8$, T> | | |
| | | M[2]:<$Y_5$, B> | | |
| | | M[3]:<$Y_4$, T> | | |
| | | M[4]:<$Y_1$, B> | | |

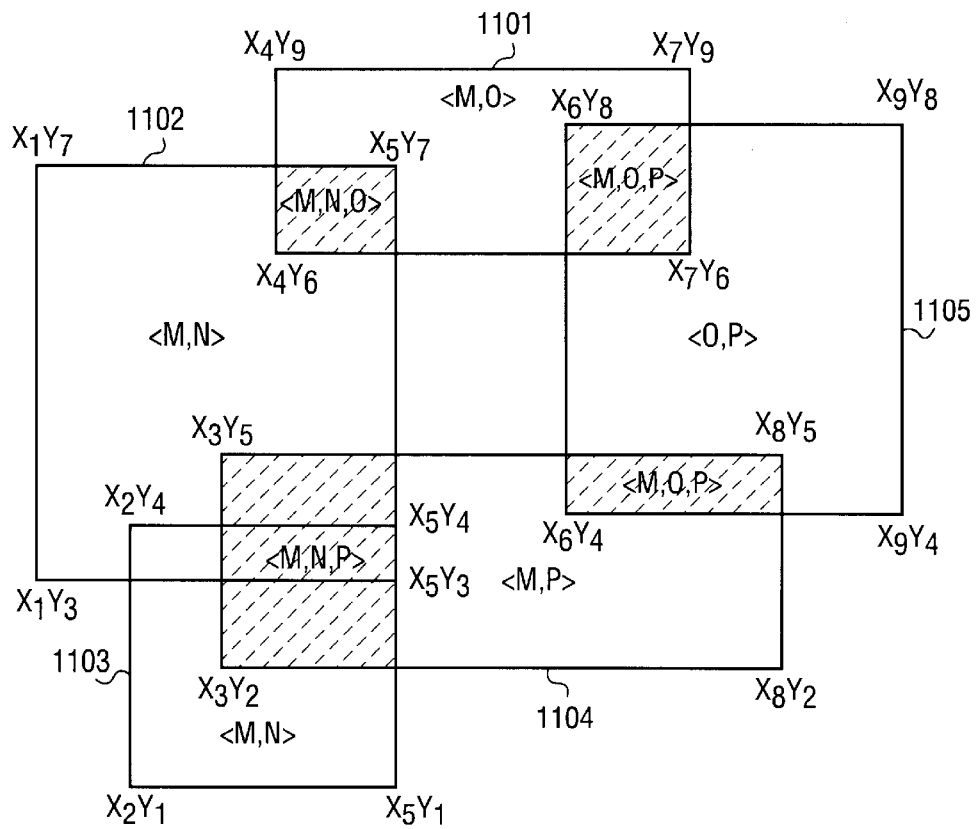

| L | $X_1$ | $X_4$ | $X_6$ |
|---|---|---|---|
| L[1]:<$X_1,Y_3$,I,B,M,N> | M[1]:<$Y_7$,T,M,N> | M[1]:<$Y_9$,T,M,O> | M[1]:<$Y_9$,T,M,O> |
| L[2]:<$X_1,Y_7$,I,T,M,N> | M[2]:<$Y_3$,D,M,N> | M[2]:<$Y_7$,T,M,N> | M[2]:<$Y_8$,T,O,P> |
| L[3]:<$X_2,Y_1$,I,B,M,N> | $X_2$ | M[3]:<$Y_6$,B,M,O> | M[3]:<$Y_6$,B,M,O> |
| L[4]:<$X_2,Y_4$,I,T,M,N> | M[1]:<$Y_7$,T,M,N> | M[4]:<$Y_5$,T,M,P> | M[4]:<$Y_5$,T,M,P> |
| L[5]:<$X_3,Y_2$,I,B,M,P> | M[2]:<$Y_4$,T,M,N> | M[5]:<$Y_4$,T,M,N> | M[5]:<$Y_4$,B,O,P> |
| L[6]:<$X_3,Y_5$,I,T,M,P> | M[3]:<$Y_3$,B,M,N> | M[6]:<$Y_3$,B,M,N> | M[6]:<$Y_2$,B,M,P> |
| L[7]:<$X_4,Y_6$,I,B,M,O> | M[4]:<$Y_1$,B,M,N> | M[7]:<$Y_2$,B,M,P> | $X_7$ |
| L[8]:<$X_4,Y_9$,I,T,M,O> | $X_3$ | M[8]:<$Y_1$,B,M,N> | M[1]:<$Y_8$,T,O,P> |
| L[9]:<$X_5,Y_1$,D,B,M,N> | M[1]:<$Y_7$,T,M,N> | $X_5$ | M[2]:<$Y_5$,T,M,P> |
| L[10]:<$X_5,Y_3$,D,B,M,N> | M[2]:<$Y_5$,T,M,P> | M[1]:<$Y_9$,T,M,N> | M[3]:<$Y_4$,B,O,P> |
| L[11]:<$X_5,Y_4$,D,T,M,N> | M[3]:<$Y_4$,T,M,N> | M[2]:<$Y_6$,B,M,O> | M[4]:<$Y_2$,B,M,P> |
| L[12]:<$X_5,Y_7$,D,T,M,N> | M[4]:<$Y_3$,B,M,N> | M[3]:<$Y_5$,T,M,P> | $X_8$ |
| L[13]:<$X_6,Y_4$,I,B,O,P> | M[5]:<$Y_2$,B,M,P> | M[4]:<$Y_2$,B,M,P> | M[1]:<$Y_8$,T,O,P> |
| L[14]:<$X_6,Y_8$,I,T,O,P> | M[6]:<$Y_1$,B,M,N> | | M[2]:<$Y_4$,B,O,P> |
| L[15]:<$X_7,Y_6$,D,B,M,O> | | | |
| L[16]:<$X_7,Y_9$,D,T,M,O> | | | |
| L[17]:<$X_8,Y_2$,D,B,M,P> | | | |
| L[18]:<$X_8,Y_5$,D,T,M,P> | | | FIG. 11 |
| L[19]:<$X_9,Y_4$,D,B,O,P> | | | |
| L[20]:<$X_9,Y_8$,D,T,O,P> | | | |

$\boxed{X_1}$ (AT BLOCK 830)

|   | S | P | R | NETS INPINR? | CALL AREA? |
|---|---|---|---|---|---|
| J=1 | <M,N> | <M,N> | <∅> | N | N |
| J=2 | <∅> | <∅> | <M,N> | N | Y |

$\boxed{X_2}$

|   | S | P | R | NETS INPINR? | CALL AREA? |
|---|---|---|---|---|---|
| J=1 | <M,N> | <M,N> | <∅> | N | N |
| J=2 | <M,N,M,N> | <M,N,M,N> | <M,N> | Y | N |
| J=3 | <M,N> | <M,N> | <M,N,M,N> | Y | N |
| J=4 | <∅> | <∅> | <M.N> | N | Y |

$\boxed{X_3}$

|   | S | P | R | NETS INPINR? | CALL AREA? |
|---|---|---|---|---|---|
| J=1 | <M,N> | <M,N> | <∅> | N | N |
| J=2 | <M,N,M,P> | <M,N,M,P> | <M,N> | N | Y |
| J=3 | <M,N,M,P,M,N> | <M,N,M,P,M,N> | <M,N,M,P> | Y | N |
| J=4 | <M,N,M,P> | <M,N,M,P> | <M,N,M,P,M,N> | Y | N |
| J=5 | <M,N> | <M,N> | <M,N,M,P> | N | Y |
| J=6 | <∅> | <∅> | <M,N> | N | Y |

⋮

$\boxed{X_5}$

|   | S | P | R | NETS INPINR? | CALL AREA? |
|---|---|---|---|---|---|
| J=1 | <M,O> | <M,O> | <∅> | N | N |
| J=2 | <∅> | <∅> | <M,O> | N | Y |
| J=3 | <M,P> | <M,P> | <∅> | N | Y |
| J=4 | <∅> | <∅> | <M,P> | N | Y |

SAMPLE LIST Q (UNSORTED)

M,N: $[Y_7 - Y_3]^*[X_2 - X_1] + [Y_7 - Y_1]^*[X_3 - X_2] + [Y_7 - Y_5]^*[X_4 - X_3] + \cdots$
M,N,P: $[Y_5 - Y_2]^*[X_4 - X_3] + [Y_5 - Y_2]^*[X_5 - X_4]$
M,N,O:
⋮

FIG. 12

(A) STATIC-INTERVAL-TREE (B) DYNAMIC-INTERVAL-TREE AFTER INSERTION OF THE FIRST THREE SEGMENTS: <1,3>,<5,6>,<2,4>

(C) DYNAMIC-INTERVAL-TREE AFTER INSERTION OF <4,6>

(D) EXAMPLE SET OF RECTANGLES

US 6,519,499 B1

METHOD AND APPARATUS FOR EXTRACTING BRIDGES FROM AN INTEGRATED CIRCUIT LAYOUT

REFERENCE TO RELATED APPLICATION

This application is a continuation-in-part of application Ser. No. 09/442,119, filed Nov. 17, 1999 entitled A METHOD AND APPARATUS FOR EXTRACTING BRIDGES FROM AN INTEGRATED CIRCUIT LAYOUT, assigned to the assignee of the present invention.

BACKGROUND

An embodiment of the present invention relates to the field of analysis of defects in integrated circuits and, more particularly, to extracting likely bridge sites.

A list of bridges may be identified during defect analysis. A bridge occurs due to a point defect that extends across two or more conductive lines or nets to cause an electrical short between them.

The likelihood of occurrence of a particular bridge may be measured by its weighted critical area (WCA). The critical area for a two net bridge for a given defect size, as the term is used herein, is the area over which the center of the defect can lie and cause the two nets to bridge. The WCA of two or more nets is defined as the sum of the critical areas for a particular defect size weighted by the probability of occurrence of that defect size.

Carafe, developed at the University of California, Santa Cruz, is an example of a tool that may be used to extract potential bridges. For each layer and each adjacent layer pair in a flattened layout of an integrated circuit, Carafe generates fault primitives referred to as "length-widths." Then, for each defect size to be analyzed, Carafe calculates corresponding critical areas from each of the length-widths. These critical areas are merged or intersected for an entire layer or layer pair to produce the critical area contribution of two-net bridges and/or multi-net bridges for the layer or layer pair for the particular defect size. The critical areas for each layer and layer pair for that defect size are then added together to find the overall critical area for the defect size. This overall critical area is then weighted with corresponding defect data to produce the WCA for the defect size. The above-described method is repeated for each defect size.

This approach has a drawback in that critical areas are computed from fault primitives for each separate defect size to be analyzed. These calculations can be time consuming, particularly where many defect sizes are used. As more defect sizes are used to more closely approximate a range of defect sizes, this inefficiency becomes even more pronounced and may preclude the use of this tool for larger or more complex layouts. Further, merging the critical areas for an entire layer or layer pair can be expensive both in terms of time and storage space on a host computer.

CREST, developed at Carnegie Mellon University, is another example of a prior fault extraction tool. CREST calculates the WCA of bridges from a hierarchical layout description. By using a hierarchical layout description instead of a flattened layout as used by Carafe, CREST may save storage space on a host computer. In doing so, however, CREST may sacrifice accuracy in computing WCA values and may fail to identify important bridges that could be identified using the flattened layout. Further, CREST currently does not identify multi-net bridges.

LOBS is another example of a prior fault extraction tool. LOBS uses a sliding window algorithm to identify critical areas. LOBS places a "window" at one corner of a layout in a layer or layer pair. A small set of rules is then used to calculate the critical area contributions from the region of the layout within the window. The window is then shifted to an adjacent area and the process is repeated until the entire layout has been covered. In using the predefined rules for calculating the critical area within the window, LOBS uses approximations when the rules are not readily applicable. These approximations can cause accuracy problems that may adversely affect the output from this tool. Further LOBS is only capable of performing two-net analysis.

Thus, the particular extraction tool used to identify likely bridges can have a significant impact on the accuracy and efficiency of the fault extraction process. Inaccurate fault extraction may compromise the quality of integrated circuit tests developed based on the output of the fault extraction. Inefficient fault extraction may take an excessive amount of time such that it is not feasible to completely analyze larger, more complex circuits.

As integrated circuits continue to increase in complexity, fault extraction using prior fault extraction tools may become increasingly difficult. Further, prior fault extraction tools may not provide the capability and/or may not be efficient enough to determine critical areas corresponding to bridges that bridge more than two nets (referred to herein as multi-net bridges).

BRIEF DESCRIPTION OF THE DRAWINGS

The present invention is illustrated by way of example and not limitation in the figures of the accompanying drawings in which like references indicate similar elements, and in which:

FIG. 6 is a diagram showing an example of four critical areas to be merged for a particular net-name pair in the two-net analysis mode.

FIG. 11 is a diagram showing an example of four overlapping critical areas that correspond to various net-name pairs and data that may be used to determine critical in the multi-net analysis mode.

FIG. 12 shows exemplary data that may be used to determine critical areas of bridges according to the methods shown in FIGS. 13 and 14 and an exemplary list of critical areas that may be produced as a result.

DETAILED DESCRIPTION

A method and apparatus for extracting bridges from an integrated circuit layout are described. In the following description, particular system configurations and critical area configurations are described for purposes of illustration. It will be appreciated, however, that other embodiments are applicable to other types of systems and to critical areas arranged in another manner.

For one embodiment, a weighted critical area calculator includes a two-net analysis mode and a multi-net analysis mode. Where the weighted critical area analysis is performed by considering defects that cause pairs of nets to bridge without consideration of whether or not a defect bridges any other net, the analysis is referred to as two-net analysis. Where additional nets are considered, the analysis is referred to as multi-net analysis.

For one embodiment, for a two-net analysis approach, potential two-net bridge faults are identified by first determining maximum critical areas from an integrated circuit layout as described in more detail below. "Maximum critical area," as the term is used herein, refers to a critical area for the maximum defect size to be evaluated.

Each identified maximum critical area is associated with a net-name pair. (Net names and net-name pairs are described in more detail below.) Then, for each net-name pair, for each defect size smaller than the maximum defect size, the maximum critical area(s) corresponding to the net-name pair is resized to produce a critical area(s) corresponding to the defect size.

The area of the union of critical areas corresponding to the net-name pair and defect size is then calculated. This area can then be weighed with the probability of the defect size and added to a weighted critical area (WCA) for the net-name pair.

For another embodiment, for a multi-net analysis, maximum overlap rectangles are identified and resized in a similar manner to the maximum critical areas above to produce overlap rectangles corresponding to each defect size to be evaluated. Critical areas for two-net and multi-net bridges (i.e. bridges that bridge more than two nets) are then determined using the overlap rectangles for the two-net bridges. These critical areas can also be weighed with the probability of the defect size to produce a weighted critical area (WCA) for the corresponding two-net and/or multi-net bridge.

Using the above approaches, calculation of critical areas and WCAs improves in efficiency over prior approaches such that WCAs can be extracted, even for relatively large layouts, in less time. Further, less storage space may be required as compared to some prior approaches. These benefits may be realized while providing good accuracy, even for bridges that bridge more than two nets, such that tests developed as a result of this bridge fault extraction may be targeted to realistic bridge faults.

Figure 1:
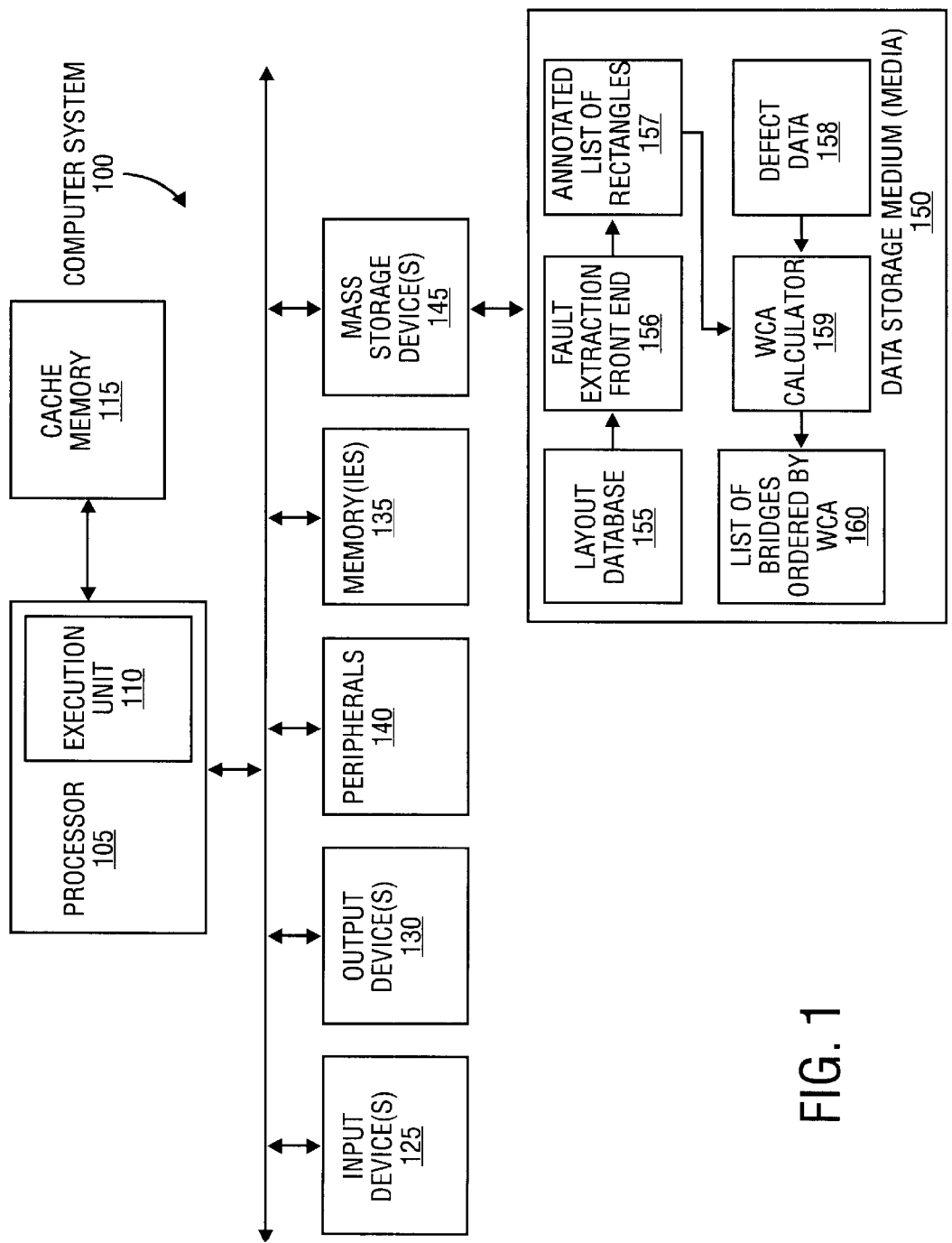
FIG. 1 is a block diagram of a computer system in which the bridge fault extraction tool of some embodiments, including a weighted critical area calculator, may be implemented.

FIG. 1 is a block diagram of a computer system 100 in which the bridge fault extraction method and apparatus of some embodiments may be implemented. For this embodiment, the computer system 100 is a workstation computer system such as a Hewlett Packard HP 9000 Enterprise Server manufactured by Hewlett Packard Company of Palo Alto, Calif. Other types of workstations and/or other types of computer systems are within the scope of various embodiments.

The computer system 100 includes a processor 105 that executes instructions using an execution unit 110. A cache memory 115 may be coupled to the processor 105 to store recently and/or frequently used instructions. The processor 105 is coupled to a bus 120 to communicate information between the processor 105 and other components in the computer system 100.

Also coupled to the bus 120 are one or more input devices 125, such as a keyboard and/or a cursor control device, one or more output devices 130, such as a monitor and/or printer, one or more memories 135 (e.g. random access memory (RAM), read only memory (ROM), etc.), other peripherals 140 (e.g. memory controller, graphics controller, bus bridge, etc.), and one or more mass storage devices 145.

The mass storage device(s) 145 may include a hard disk drive, a compact disc read only memory (CD ROM) drive and/or an optical disk drive, for example. Further, the mass storage device(s) 145 may include additional mass storage device(s) that are accessible by the computer system 100 over a network (not shown).

A corresponding data storage medium (or media) 150 (also referred to as a computer-readable storage medium) may be used to store instructions, data and/or one or more programs to be executed by the processor 100. For one embodiment, the data storage medium (or media) 150 stores information and programs 155–160 of one embodiment that are used to perform bridge fault extraction.

For this embodiment, a layout database 155 is provided to a fault extraction front end 156. The fault extraction front end 156 of this embodiment produces a flattened layout in the form of an annotated list of rectangles 157. The list of rectangles is annotated to indicate X and Y coordinates in the layout for at least two diagonally opposite corner points of each rectangle and, in some embodiments, all four corner points of each rectangle. The X and Y coordinates of each rectangle corner point may be specified relative to a selected corner of the integrated circuit layout for one embodiment. Other approaches to indicating the relative positions of the rectangles in the layout are within the scope of various embodiments. The annotations for one embodiment further indicate a net-name for each rectangle that corresponds to a net. The net-name identifies the particular net or signal (e.g. memory read signal, bit 0 of front-side bus, etc.) with which a rectangle is associated. For one embodiment, net-names may be assigned by the designer during the process of developing the layout and are provided in the layout itself.

Defect data 158 indicates defect distributions for the fabrication process to be used to produce the integrated circuit that is the subject of fault extraction. Point defects are assumed for one embodiment. The defect data 158 indicates a probability of occurrence of defects of different sizes to be used in the fault extraction process.

The annotated list of rectangles 157 and defect data 158 are provided to a WCA calculator 159. The WCA calculator 159 operates in the manner described below to produce a list 160 of realistically possible two-net and/or multi-net bridges ordered by WCA. The list of bridges 160 may then be used to develop manufacturing tests, perform fault diagnosis, etc.

Figure 2:
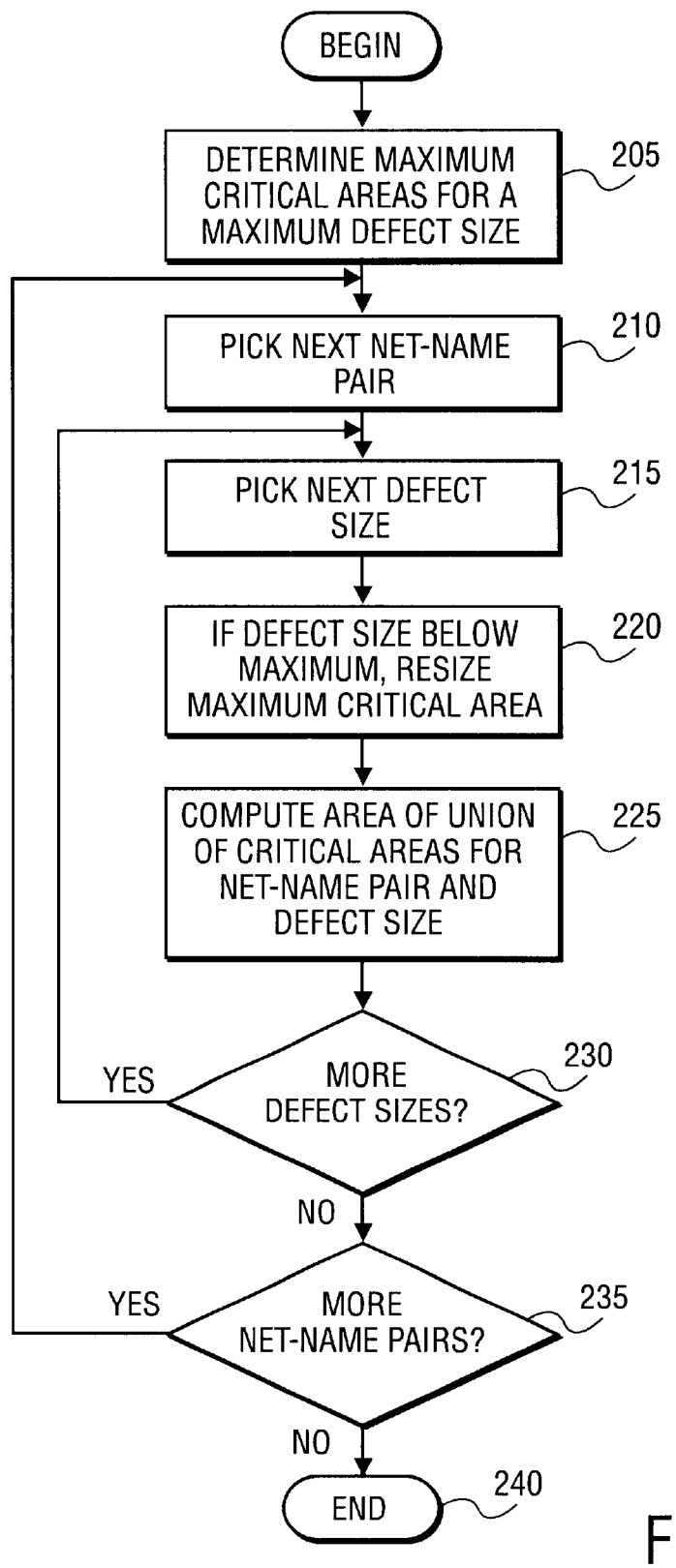
FIG. 2 is a flow diagram showing the method of one embodiment for calculating weighted critical areas in a two-net analysis mode.

FIG. 2 is a flow diagram showing one embodiment of a method for performing bridge fault extraction in a two-net analysis mode that may be used by the WCA calculator 159 of FIG. 1. Given a layout for an integrated circuit, at block 205, maximum critical areas corresponding to a maximum defect size to be evaluated are determined. One approach to determining the maximum critical areas is described in more detail below with reference to FIG. 3.

Then, as indicated by blocks 210 and 215, for each net-name pair that has one or more corresponding maximum critical areas and for each defect size to be evaluated: 1) at block 220, the maximum critical area(s) are resized to correspond to the defect size being evaluated and 2) at block 225, the area of the union of critical areas for the net-name pair and defect size is computed. Some approaches to resizing the maximum critical area(s) (block 220) and calculating the area of the union of critical areas (block 225) are described below in reference to FIGS. 3–8.

At decision block 230, if there are more defect sizes to be evaluated, the method continues at block 215. If not, then at decision block 235, if there are more net-name pairs to be evaluated, the method continues at block 210. Otherwise, the method ends at block 240.

Figure 3:
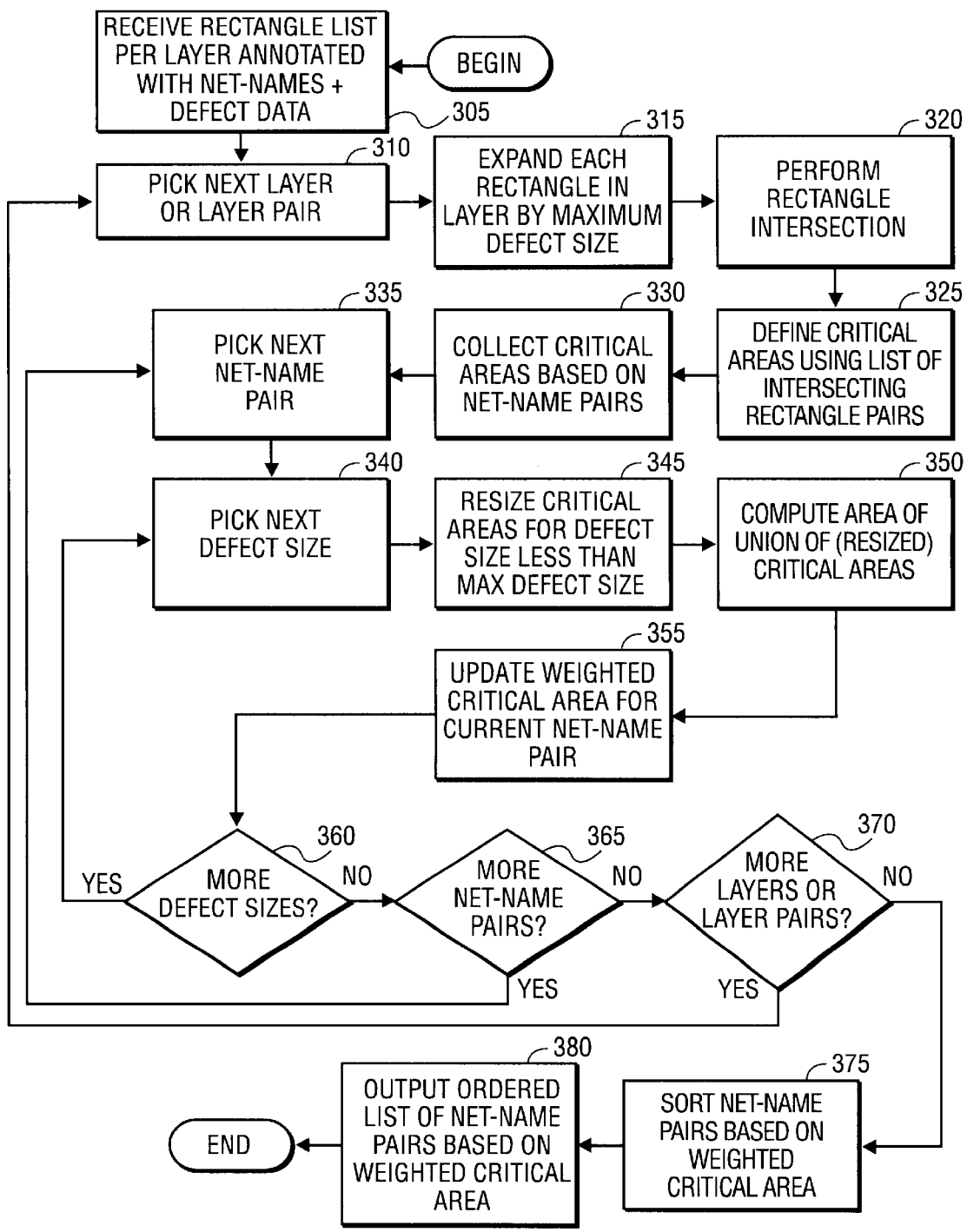
FIG. 3 is a flow diagram showing the method of another embodiment for calculating weighted critical areas in the two-net analysis mode.

FIG. 3 is a flow diagram showing another embodiment of a method for performing bridge fault extraction using a two-net analysis mode that may be used by the WCA calculator 159 of FIG. 1. At block 305, defect data that indicates defect distributions for various defect sizes and a list of rectangles annotated with corresponding net-names and rectangle corner point coordinates are received.

Typical integrated circuits include multiple layers of structures that are interconnected to form the integrated circuit. As such, it is important not only to find potential bridge faults in each layer of an integrated circuit structure, but also any faults that may cause bridges between parts of nets running on adjacent layers. For the embodiment illustrated by FIG. 3, bridge fault extraction is performed layer by layer to identify intra-layer faults and layer pair by layer pair to identify inter-layer faults.

At block 310, a next layer or layer pair to be analyzed is selected. Each rectangle in the selected layer or layer pair is then expanded at block 315 by the radius of the maximum defect size. For one embodiment, for ease of calculation, defects are approximated as being square in shape. The radius of a defect for purposes of determining critical area is therefore equal to half the length of the side of the square used to approximate the defect.

Figure 4:
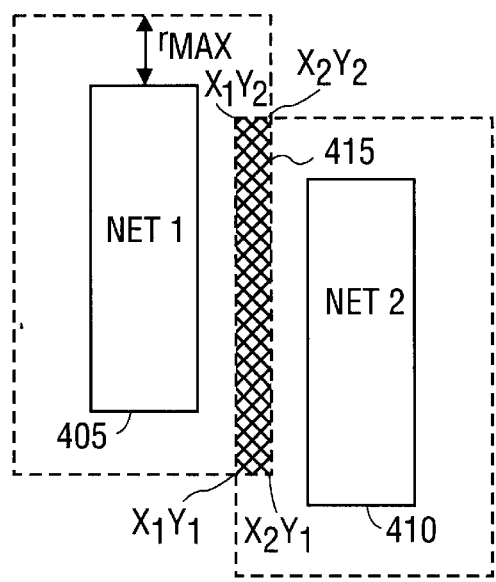
FIG. 4 is plan view of two rectangles from a layout and a corresponding maximum overlap rectangle (critical area).

FIG. 4 is a plan view of two rectangles 405 and 410 from a layout being analyzed. The rectangle 405 is part of a net referred to as NET1 in this example and the rectangle 410 is part of another net referred to as NET2. At block 310 (FIG. 3), the rectangles 405 and 410 are each expanded by the radius $r_{MAX}$ of the maximum defect size to be analyzed. The expanded rectangles are indicated by the dotted lines surrounding each of the rectangles 405 and 410.

Referring back to FIG. 3, once expanded, rectangles in the selected layer or layer pair are intersected at block 320. For one embodiment, intersections between two rectangles associated with the same net (i.e. rectangles that have the same net name) are ignored in this process.

For one embodiment, other pairs of rectangle intersection may be determined using an interval tree. An interval tree is a well-known data structure that may be used to determine overlapping intervals. A description of an interval tree is provided, for example in *Computational Geometry: An Introduction* by F. Preparata and M. I. Shamos, Springer-Verlag, 1985.

Application of the interval tree to determine rectangle intersection is described with reference to an example using the following set of intervals: {(1,3), (5,6), (2,4), (3,6), (4,6)}. This set corresponds to a set of distinct endpoints S={1, 2, 3, 4, 5, 6}. The interval tree consists of two parts: static and dynamic. In the static interval tree, there is on leaf per endpoint in the set S labeled by the endpoint itself.

Next, a balanced binary tree is built as follows. Let a be the parent of the children whose nodes are labeled by numbers $n_1$, $n_2$. Then a is labeled by $(n_1+n_2)/2$. The static interval tree of this example is shown in FIGS. 15a–e.

The dynamic component is built on top of the static tree. Each interval is stored in a dynamic data structure, which can be a balanced tree and is attached to a static node. To determine where an interval (p,q) (where p<q) is inserted, a recursive search is started at the root. Where the label on the current node is r, if $p \leq r \leq q$, then the interval is inserted in the balanced tree attached to the insert operations at an X coordinate that preceeds all the interval tree delete operations at that X coordinate. In addition, for all interval tree insert operations, all intersections with the existing segments (i.e. the corresponding rectangle pairs) in the interval tree are reported.

For the example in FIGS. 15a–e, when (I, R5, 6 (1,3)) is inserted, the segments in the interval tree are (R3, (5,6)), (R4, (2,6)). Out of these two segments, the incoming segment overlaps (2,6). Therefore, the intersection of R4, R5 is reported.

This method works for enumerating overlapping rectangles in the same layer (i.e. intra-layer intersection). For reporting inter-layer intersections, it is assumed that the list of rectangles in the layer-pair J, K is given as two separate lists. Two interval trees are maintained—one for each of the layers J and K. If an interval G in the layer J is being processed, an insertion in the interval tree for layer K is faked in that the entire process of reporting the overlapping intervals is performed, but G is not inserted into the interval tree. Next, the interval G is inserted into the interval tree for layer J but no intersections are reported.

In this manner, knowledge of the overlapping horizontal and vertical segments can be used to determine pairs of rectangles that overlap. Other approaches to identifying overlapping rectangles are within the scope of various embodiments.

Each resulting intersecting rectangle pair defines a corresponding maximum overlap rectangle. For the two-net analysis mode, this maximum overlap rectangle is referred to as a maximum critical area. Such a maximum critical area is also a rectangle having an area equal to the area of the overlap of the intersecting rectangle pair. Referring to FIG. 4, for example, the maximum critical area for the rectangles 405 and 410 is indicated by the shaded area of overlap 415.

Where a single layer is being evaluated for intra-layer faults, the areas of overlap are in the same layer. Where a layer pair is being evaluated, a first rectangle in a first layer of the layer pair may overlap with a second rectangle in a second layer of the layer pair when the first layer is superimposed on the second layer. This area of overlap also identifies a maximum critical area.

Maximum critical areas are defined at block 325 from the intersecting list of rectangle pairs. The maximum critical areas are specified in terms of the X and Y coordinates of the critical area corner points in the layout of the selected layer. The X and Y coordinates of the critical area 415, for example, are <$(X_1,Y_2), (X_1,Y_1), (X_2,Y_1), (X_2,Y_2)$>. As described above, X and Y coordinates for all four corner points or two diagonally opposite corner points may be specified and stored depending on the desired approach. Where all four corner points of the maximum critical area are specified, for one embodiment, they are specified in a counter-clockwise direction starting with the top left corner (according to X and Y coordinate values). For other embodiments, the corner points may be specified in a different order. The net-name pair with which the maximum critical area is associated (i.e. the two nets that would be bridged by the defect) is also specified for one embodiment. For the rectangles 405 and 410 of FIG. 4, for example, the net-name pair is NET1–NET2.

For one embodiment, as each maximum critical area is identified, it is collected or bucketed at block 330 based on the net-name pair associated with the maximum critical area. This bucketing may be accomplished, for example, by collecting two diagonally opposite corner points of each critical area corresponding to each net-name pair.

The fault extraction method of one embodiment then proceeds net-name pair by net-name pair for each defect size to be analyzed. At block 335, the first net-name pair to be evaluated is selected and at block 340, the first defect size to be evaluated is selected. For one embodiment, the net-name pairs are evaluated in alphabetical or numerical order. For other embodiments, a different approach to choosing the order in which net-name pairs are evaluated may be used. Also for one embodiment, at block 340, the maximum defect size is selected first and remaining defect sizes are evaluated in descending order from the maximum defect size.

Figure 5:
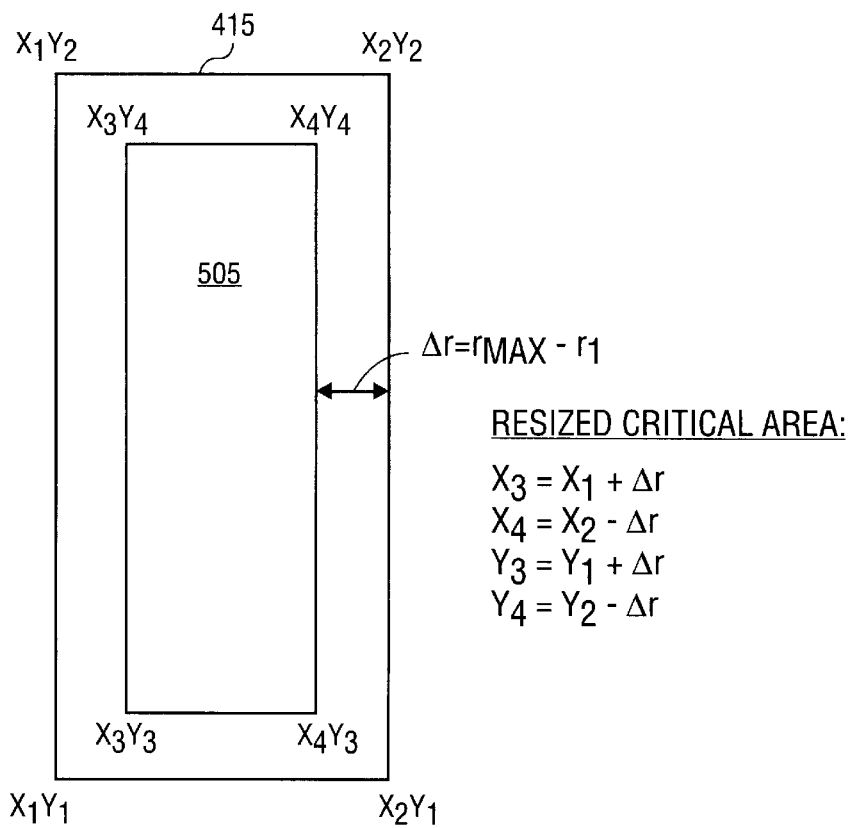
FIG. 5 is a plan view of the maximum critical area of FIG. 4 and a resized overlap rectangle (critical area) for a given defect radius.

At block 345, if the defect size being evaluated is less than the maximum defect size, then the maximum critical areas (i.e. maximum overlap rectangles) associated with the selected net-name pair are resized to correspond to the selected defect size. For one embodiment, the maximum critical areas are resized by subtracting the difference between the radius of the maximum defect size and the radius of the defect size being evaluated from all sides of the maximum critical area rectangles. For example, FIG. 5 shows the maximum critical area 415 of FIG. 4 and resized critical area 505 for a defect radius $r_1$. As shown, the resizing operation is performed on the X and Y coordinates of the maximum critical area 415 to produce new X and Y coordinates of the resized overlap rectangle 405 (referred to as the resized critical area for the two-net analysis mode).

For one embodiment, in the two-net analysis mode, for each defect size below the maximum defect size, critical areas are resized from the maximum critical areas in the manner described above. For another embodiment, at block 345, critical areas corresponding to the current defect size being evaluated are determined by resizing the critical area corresponding to the next larger defect size. For such an embodiment, Δr in FIG. 5 is equal to the radius of the previous (i.e. next largest) defect size minus the radius of the current defect size being analyzed. For this embodiment, defect sizes are evaluated in descending order from the maximum defect size.

For some net-name pairs and defect sizes, there may be multiple corresponding critical areas that may themselves overlap. For such cases, the critical area for the net-name pair is the area of the union of all of the corresponding critical areas for the particular defect size. At block 350, this area of the union of critical areas is calculated of the net-name pair and defect size being evaluated.

One embodiment of a method that may be used at block 350 to calculate the union of critical areas for a particular net-name pair and defect size is described with reference to FIGS. 6, 7 and 8.

Figure 7:
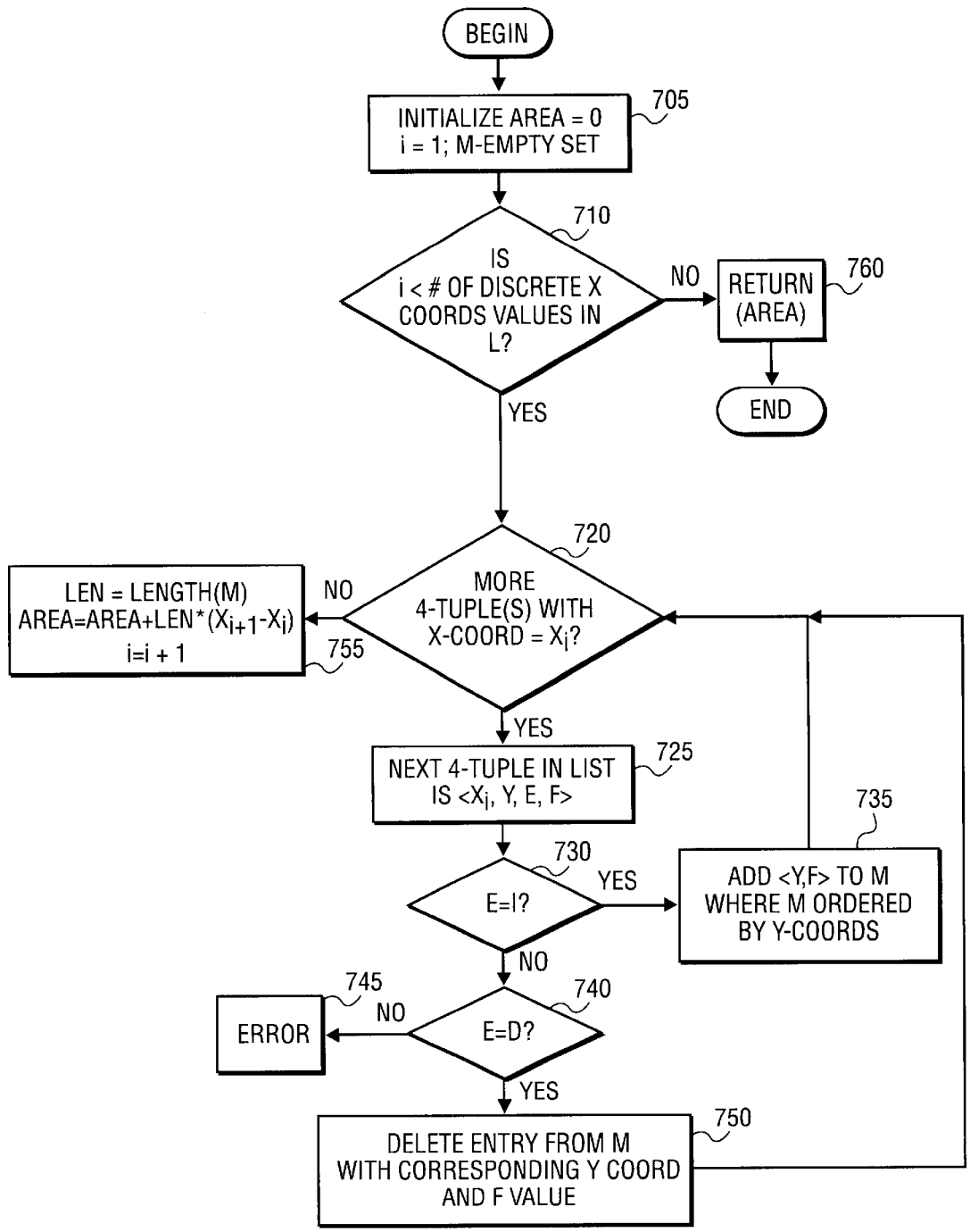
FIG. 7 is a flow diagram showing one embodiment of a method for computing an area of a union of critical areas in the two-net analysis mode.
Figure 8:
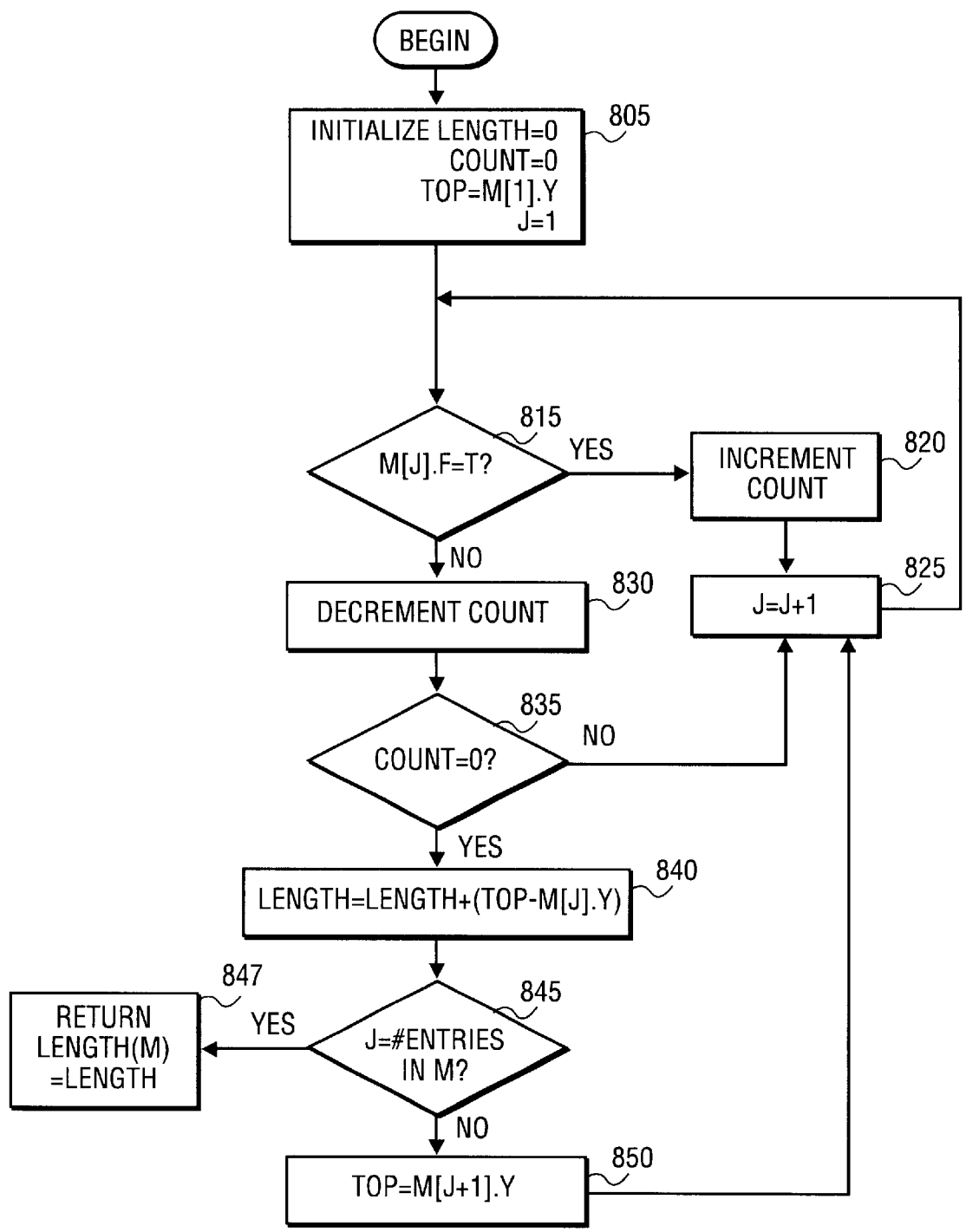
FIG. 8 is a flow diagram showing one embodiment of a method for calculating a length that may be used in the method of FIG. 7.

For purposes of illustration, exemplary overlapping critical areas A, B, C and D for a particular net-name pair (NET3–NET4, for example) and defect size are shown in FIG. 6, which is referenced in the description corresponding to FIGS. 7 and 8. The rectangles A, B, C and D each have corner points at the X and Y coordinates shown in FIG. 6. While four overlapping critical area rectangles are shown in FIG. 6, it will be appreciated that the method described in reference to FIGS. 7 and 8 may be used to merge a larger or smaller number of overlapping critical area rectangles.

For one embodiment, for maximum and resized critical areas, the corner points are specified as 4-tuples <X,Y,E,F> where X and Y are the X and Y coordinates of the corresponding corner point. For the example described below, "E" in the 4-tuple is either "I" to indicate an insert event or "D" to indicate a delete event. For this example, each corner point on the left side of the rectangle (i.e. smaller X coordinate) is indicated as an insert event and each corner point on the right side of the rectangle (i.e. larger X coordinate) is indicated as a delete event. Also in this example, "F" in the 4-tuple is either "T" to indicate the top of the rectangle (i.e. larger Y coordinate) or "B" to indicate the bottom of the rectangle (i.e. smaller Y coordinate). Other approaches to indicating an insert or delete event and/or to indicating the top or bottom of a rectangle are also within the scope of various embodiments.

As the 4-tuples described above are generated, they are inserted into an ordered list L where L is sorted in increasing order by the X coordinate value indicated in the 4-tuple. An example of such an ordered list L for the rectangles A, B, C and D of FIG. 6 is shown in FIG. 6. For one embodiment, at any given point in time, there is only one list L that corresponds to the particular net-name pair being evaluated. Once the area of the union of critical areas for that particular net-name pair has been calculated, the list L for that net-name pair may be discarded and a new list L is generated for the next net-name pair to be evaluated.

FIG. 7 is a flow diagram showing a method of one embodiment for determining the area of a union of critical areas for the two-net analysis mode. At block 705, a variable, AREA, is initialized to zero, a variable i is set to 1 and set M is an empty set. AREA is used to indicate the area of the union of critical areas while i is used as an index to indicate the particular X coordinate being evaluated. M is a list that is extracted from the ordered list L of 4-tuples corresponding to the net-name pair being evaluated as described in more detail below.

At decision block 710, it is determined whether the variable i is less than the number of discrete X coordinate values in the ordered list L. For the example shown in FIG. 6, there are eight discrete X coordinates $X_1$–$X_8$. If i is less than the number of discrete X coordinates in L, then at decision block 720 it is determined whether there are more 4-tuples in L having an X coordinate equal to $X_i$. If so, then at block 725, the next 4-tuple having an X coordinate equal to $X_i$ is evaluated. For the list L shown in FIG. 6, for example, for i=1, the first 4-tuple in L having an X coordinate equal to $X_i$, is L[1]:<$X_1,Y_2,I,B$>.

At decision block 730, if the "E" variable of the 4-tuple (in the format <X,Y,E,F>) is equal to "I" or otherwise indicates an insert event as described above, the Y coordinate value and the value of the "F" variable of the 4-tuple are added to the set M at block 735. For one embodiment, M is ordered in decreasing order by the Y coordinate value.

Referring again to the example in FIG. 6, the "E" variable of the 4-tuple L[1] is equal to "I" so <$Y_2$,B> of the 4-tuple is added to M as indicated under $X_1$. Following the same process starting at decision block 720, <$Y_6$,T> of the 4-tuple L[2] is also added to M as shown in FIG. 6. When <$Y_6$,T> is added to M, it becomes the first entry M[1] because the value of the Y coordinate $Y_6$ is greater than the value of the Y coordinate $Y_2$ of the other entry in the list M.

It will be appreciated that, while FIG. 6 shows seven different lists M (one for each of the X coordinates $X_1$–$X_7$), for one embodiment, M is one list that is added to and subtracted from in the manner shown in FIG. 7. Each of the seven lists under the headings $X_1$–$X_7$ indicates the state of the list M after the entries in L corresponding to the indicated X coordinate have been evaluated in the manner shown in FIG. 7.

After the 4-tuple L[2] has been processed as described above, at decision block 720, it is determined that there are no more 4-tuples in L with an X coordinate equal to $X_1$. Processing then continues at block 755 where a partial area (indicated by the AREA variable) is calculated based on a LENGTH(M).

A method of one embodiment for determining the LENGTH(M) is illustrated in and described in reference to FIG. 8. At processing block 805, variables LENGTH, COUNT, TOP and J are initialized as indicated. The notations M[i].Y and M[i].F as shown in FIG. 8 indicate the value of the Y coordinate and the value of the "F" variable, respectively, of the entry M[i] in the list M. In the description below, FIG. 6 is referred to as an example for purposes of illustration.

At decision block 815, it is determined whether M[J].F is equal to T or otherwise indicates the top of a rectangle. Referring to the list M for $X_1$ in FIG. 6, for example, where J=1, M[1].F is equal to T. Thus, processing continues at block 820 where the variable COUNT is incremented (and now equals 1 for this example). At block 825, the variable J is incremented (and now equals 2).

The method then continues at decision block 815 where it is determined for this example, that M[2].F does not equal T or otherwise indicate the top of a rectangle. Processing continues at block 830 where COUNT is decremented (and now equals 0 for this example). Then, at decision block 835, it is determined that COUNT equals 0 so at block 840, the variable LENGTH is updated as indicated. For this example, the TOP variable is initialized to M[1].Y=$Y_6$ at block 805, thus, at block 840 LENGTH=0+($Y_6$–$Y_2$)=$Y_6$–$Y_2$. At decision block 845, it is determined whether J is equal to the number of entries in the list M. For this example, J=2 and the list M for $X_1$ includes 2 entries so at block 847, LENGTH (M), which equals LENGTH=$Y_6$–$Y_2$ for this example, is returned.

Referring back to FIG. 7, once LENGTH(M) is returned, a partial area is calculated as shown at block 755. For the above example, the partial area indicated by the AREA variable is now equal to 0+($Y_6$–$Y_2$)*($X_2$–$X_1$) or simply ($Y_6$–$Y_2$)*($X_2$–$X_1$). Also at block 755, the variable i is incremented and processing continues for the next discrete X coordinate ($X_2$ in this example) at decision block 710 as described above.

Because the "E" variable of each entry in L for $X_2$ also indicates an insert event, the corresponding Y coordinates and "F" variable values are added to M in the manner described above. Thus, after evaluating the entries in L for $X_2$, the list M is as shown in FIG. 6 under $X_2$. The LENGTH(M) is calculated for the list M for $X_2$ and the value of the AREA variable is updated in the manner described above for $X_1$. The value of the AREA variable at this point, for example, is updated to equal [($Y_6$–$Y_2$)*($X_2$–$X_1$)]+[($Y_6$–$Y_1$)*($X_3$–$X_2$)]. Processing for $X_3$ and subsequent updating of the AREA variable also proceeds in a similar manner.

For i=4, and thus, X=$X_4$, however, there are some differences. Referring back to decision block 730 in FIG. 7, if the "E" variable of the 4-tuple being evaluated does not indicate an insert event, then at decision block 740, it is determined whether the "E" variable equals D or otherwise indicates a delete event. If not, an error is indicated at block 745. Otherwise, processing proceeds at block 750 where an entry in the list M having a corresponding Y coordinate and "F" variable value is deleted from M.

Referring again to FIG. 6 for purposes of illustration, for $X_4$, for example, the value of the "E" variable of the first 4-tuple in L having the X coordinate $X_4$ (L[7]) equals D. The list M, before processing of 4-tuples having an X coordinate equal to $X_4$, includes the entries shown under $X_3$. Thus, at processing block 750, an entry in M having a Y coordinate equal to $Y_2$ and an "F" variable value equal to B (M[5]) is deleted from M. The only other 4-tuple in L having an X coordinate equal to $X_4$, L[8], also indicates a delete event and thus, at processing block 750, the entry M[2] having a Y coordinate equal to $Y_6$ and an "F" variable value equal to T is also deleted from the list M. In this manner, after processing the 4-tuples in L having an X coordinate equal to $X_4$, the list M includes the entries under $X_4$ in FIG. 6.

As described above, LENGTH(M) is then calculated for the list M for $X_4$ using the approach shown in FIG. 8 for one embodiment. Referring again to FIG. 8, variables are initialized as described above at block 805. At decision block 815, M[1].F=T so COUNT is incremented to equal 1 at block 820 and J is incremented to equal 2 at block 825. At decision block 815, M[2].F does not equal T or otherwise indicate the top of a rectangle so at block 830, COUNT is decremented and equals 0.

Processing then proceeds at block 840 where LENGTH is updated as indicated to equal 0+(M[1].Y–M[2].Y)=$Y_8$–$Y_5$ for this example. Then, at decision block 845, where J=2, it is determined that J does not equal the current number of entries in M, which, for this example, is 4. Thus, at processing block 850, the variable TOP is updated to equal M[J+1].Y=M[3].Y=$Y_4$ as indicated in FIG. 8. J is then incremented at block 825 and processing continues at decision block 815.

Continuing with this example, at block 815, M[3].F equals T so COUNT is incremented at block 820 and equals 1. J is incremented at block 825 and is equal to 4. Then, at decision block 815, it is determined that M[4].F does not equal T and COUNT is decremented at block 830 and is equal to 0. At block 840, LENGTH is updated to equal the previous length plus the current length or ($Y_8$–$Y_5$)+(TOP ($Y_4$)–M[4].Y) which equals ($Y_8$–$Y_5$)+($Y_4$–$Y_1$) for this example.

By determining the effective length for the partial area calculation of FIG. 7 in this manner, the method shown in FIG. 8 takes into account the fact that there is an empty space in the middle of the rectangles A, B, C, and D. Using this approach, the area of the empty space is excluded from the area calculation of the union of critical areas such that accuracy of this calculation is not compromised.

With continuing reference to FIG. 8, at decision block 845, it is determined that J (currently equal to 4) is equal to the current number of entries in M and LENGTH is returned as LENGTH(M) at block 847. Referring back to FIG. 7, the AREA variable is then appropriately updated to add the next partial area as indicated at block 755 and i is again incremented.

Processing proceeds in the above described manner to add partial areas to the overall area calculation until, at decision block 710, it is determined that the value of the variable i is not less than the number of discrete X coordinates values in L. Then, at block 760, the current value of the variable AREA, which is now equal to the area of the union of critical areas being evaluated, is returned. Thus, for the example shown in FIG. 6, once i=8, the value of AREA is returned at block 760.

Referring back to FIG. 3, once the area of the union of critical areas for the selected net-name pair and defect size has been calculated as described above, at block 355, the corresponding weighted critical area is calculated. This weighted critical area is then added to a list of weighted critical areas for the selected net-name pair. The weighted critical area for a net-name pair and defect size is equal to the area of the union of critical areas associated with the net-name pair times the probability of the occurrence of a defect of the given size. This probability information is provided as part of the defect data received at block 305 as mentioned above.

At decision block 360, if there are more defect sizes to be evaluated, the method continues at block 340 where the next defect size is selected to be evaluated as described above. If not, then at decision block 365, it is determined whether there are more net-name pairs to be evaluated for the selected layer or layer pair. If so, then the method continues at block 335 where the next net-name pair is selected and evaluated as described above.

If all defect sizes for all net-name pairs for the selected layer or layer pair have been processed, then at decision block 370, it is determined whether there are more layers and/or layer-pairs to evaluate. If so, the method continues at block 310 where the next layer or layer pair is selected and analyzed as described above.

When all layers and layer pairs have been analyzed, at block 375, net-name pairs are sorted by weighted critical area and provided in block 380 as an ordered list. The list may be ordered in decreasing order of critical area, for example.

Figure 9:
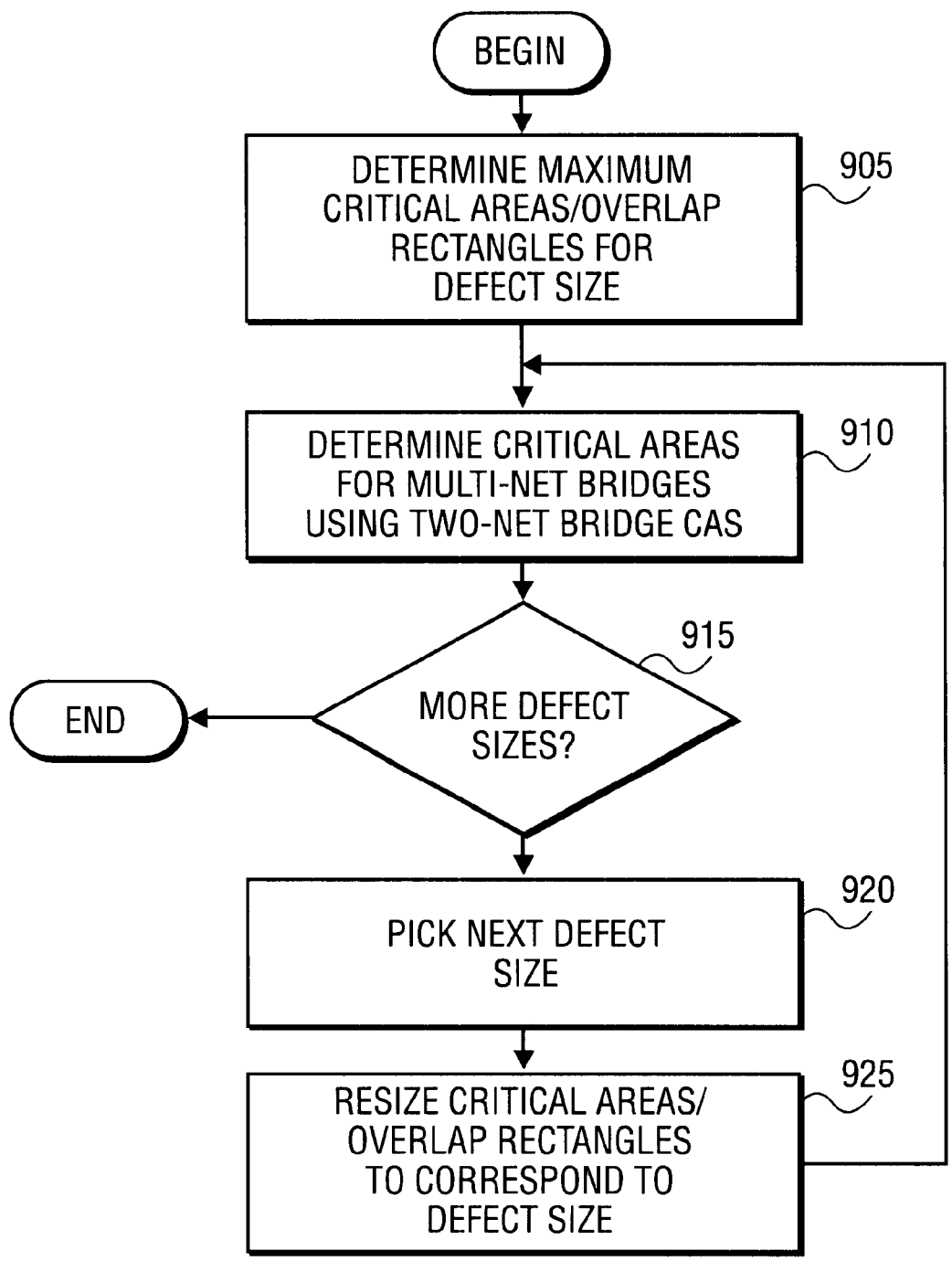
FIG. 9 is a flow diagram showing a method of one embodiment for calculating weighted critical areas for bridges in a multi-net analysis mode.

While the above-described approaches relate to a two-net analysis mode, in some circumstances it may also be desirable to identify WCAs of multi-net bridges. FIG. 9 is a flow diagram showing an embodiment of a method for performing bridge fault extraction in a multi-net analysis mode that may be used by the WCA calculator 159 of FIG. 1. Given a layout for an integrated circuit, at block 905, overlap rectangles corresponding to a defect size to be evaluated are determined. The overlap rectangles identified at block 905 correspond to two nets (i.e. net-name pairs) and may be identified in the manner described above with reference to FIG. 3. It is noted that these overlap rectangles are not referred to as or considered to be critical areas for the multi-net analysis mode.

Then, as indicated by block 910, critical areas for two-net and multi-net bridges are determined using the overlap rectangles determined for net-name pairs at block 905. At decision block 915, it is determined whether there are more defect sizes to be analyzed. If so, then at block 920, the next defect size is selected. At block 925, the previously identified two-net overlap rectangles are resized to correspond to the defect size being evaluated. The method then continues at block 910 until two-net and/or multi-net critical areas have been determined for all defect sizes to be analyzed using the overlap rectangles determined for net-name pairs.

Figure 10:
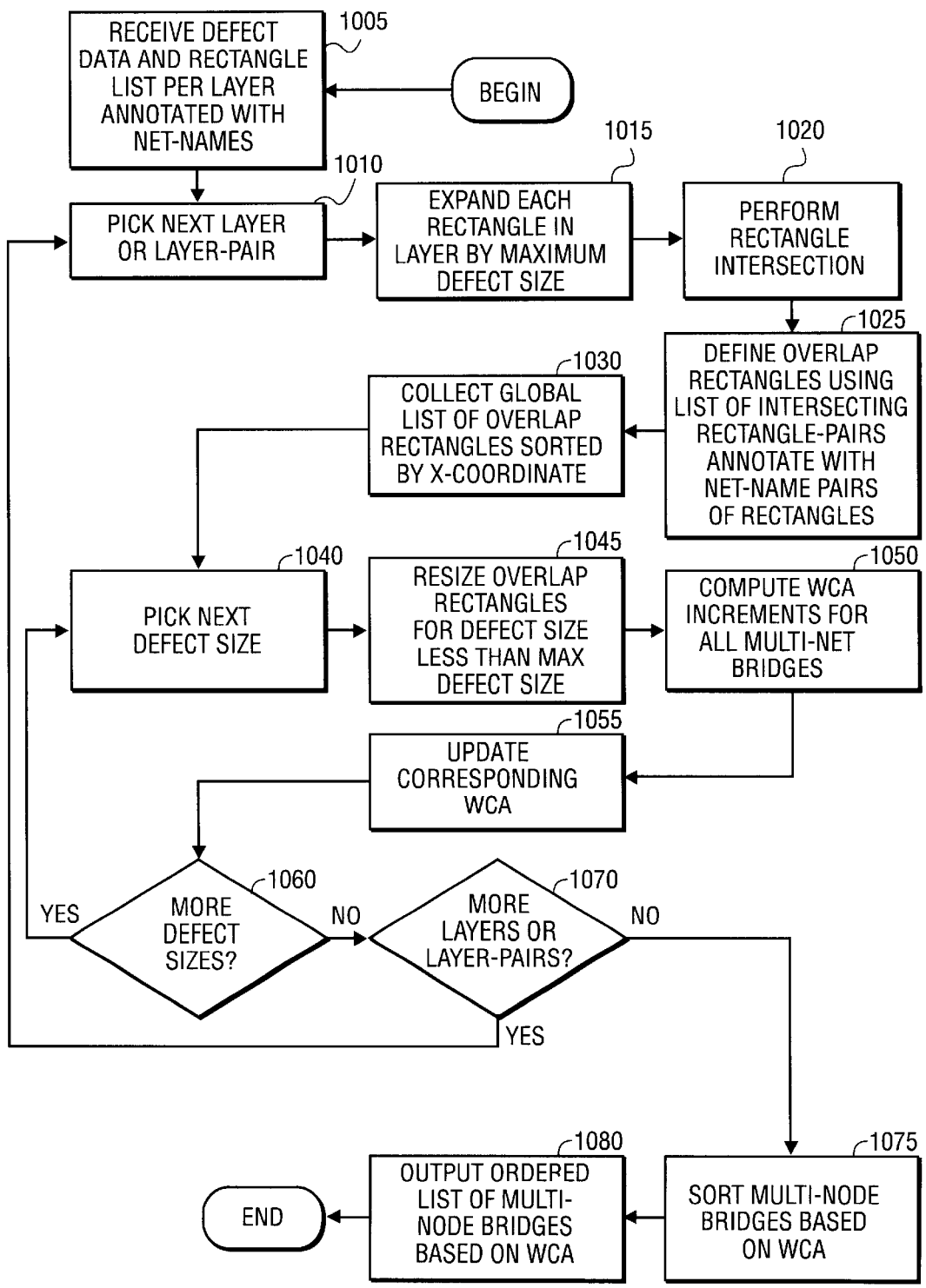
FIG. 10 is a flow diagram showing a method of another embodiment for calculating weighted critical areas for bridges in the multi-net analysis mode.

FIG. 10 is a flow diagram showing yet another embodiment of a method for performing bridge fault extraction in a multi-net analysis mode that may be used by the WCA calculator 159 of FIG. 1. At block 1005, defect data that indicates defect distributions for various defect sizes and a list of rectangles annotated with corresponding net-names and rectangle corner point coordinates are received.

At block 1010, a next layer or layer pair to be analyzed is selected. Each rectangle in the selected layer or layer pair is then expanded at block 1015 by the radius of the maximum defect size and intersected at block 1020 as described above to identify maximum overlap rectangles which are defined at block 1025.

At block 1030, a global list L of net-name pair overlap rectangles is developed as the overlap rectangles are defined at block 1025. The global list is provided, for one embodiment, in the form of 6-tuples including one 6-tuple <X,Y,E,F,m,n> for each corner point of each overlap rectangle. As for the 4-tuples described above, X and Y are the X and Y coordinates of the corresponding corner point, "E" is either "I" to indicate an insert event or "D" to indicate a delete event and "F" is either "T" to indicate the top of the rectangle or "B" to indicate the bottom of the rectangle. The last two entries, m and n, in the 6-tuple indicate the net-name pair with which the corresponding overlap rectangle is associated.

As the 6-tuples are generated, they are ordered in the list L by increasing order of X coordinate value. An example of such an ordered list L for overlap rectangles 1101–1105 of FIG. 11 is shown in FIG. 11. The letters in the brackets (e.g. <M,N> for the overlap rectangle 1102) indicate the particular net-name pair to which the overlap rectangle corresponds.

The fault extraction method of one embodiment then proceeds at block 1040 where the first defect size to be evaluated is selected. For one embodiment, at block 1040, the maximum defect size is selected first and remaining defect sizes are evaluated in descending order from the maximum defect size.

At block 1045, if the defect size being evaluated is less than the maximum defect size, then the overlap rectangles associated with the selected net-name pair are resized to correspond to the selected defect size as described above. For one embodiment, a new ordered list L of 6-tuples is created for each defect size below the maximum defect size as the overlap rectangles are resized at block 1045. The previous list L may be overwritten once an ordered list of WCAs for that particular defect size has been developed as explained below and/or once a new list L for the next defect size has been developed.

At block 1050, critical areas for two-net and multi-net bridges are computed in increments. One embodiment of a method that may be used at block 1050 to calculate critical areas for a particular defect size is described with reference to FIGS. 11, 12, 13 and 14.

Figure 13:
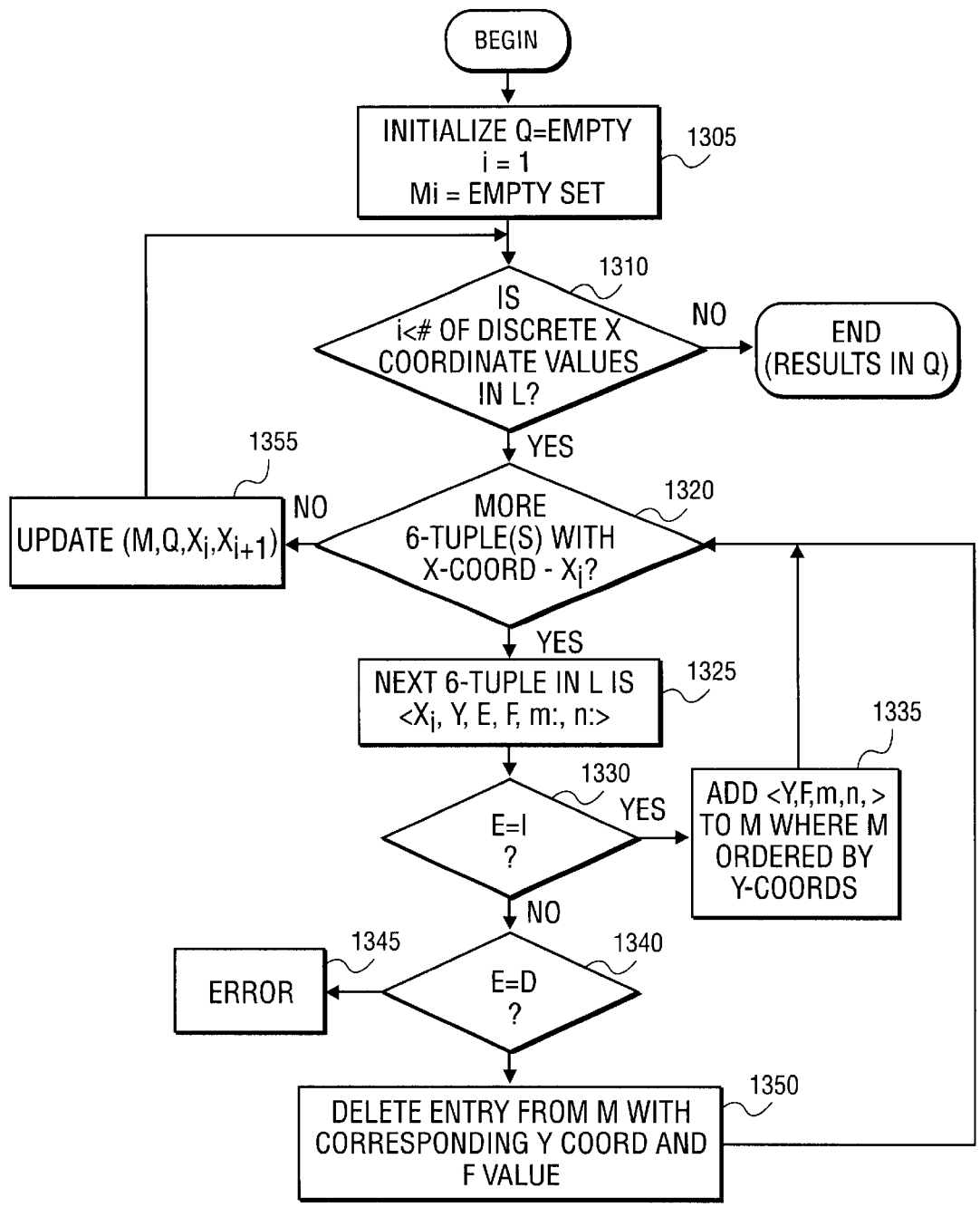
FIG. 13 is a flow diagram showing one embodiment of a method for computing critical areas in the multi-net analysis mode for a given defect size.
Figure 14:
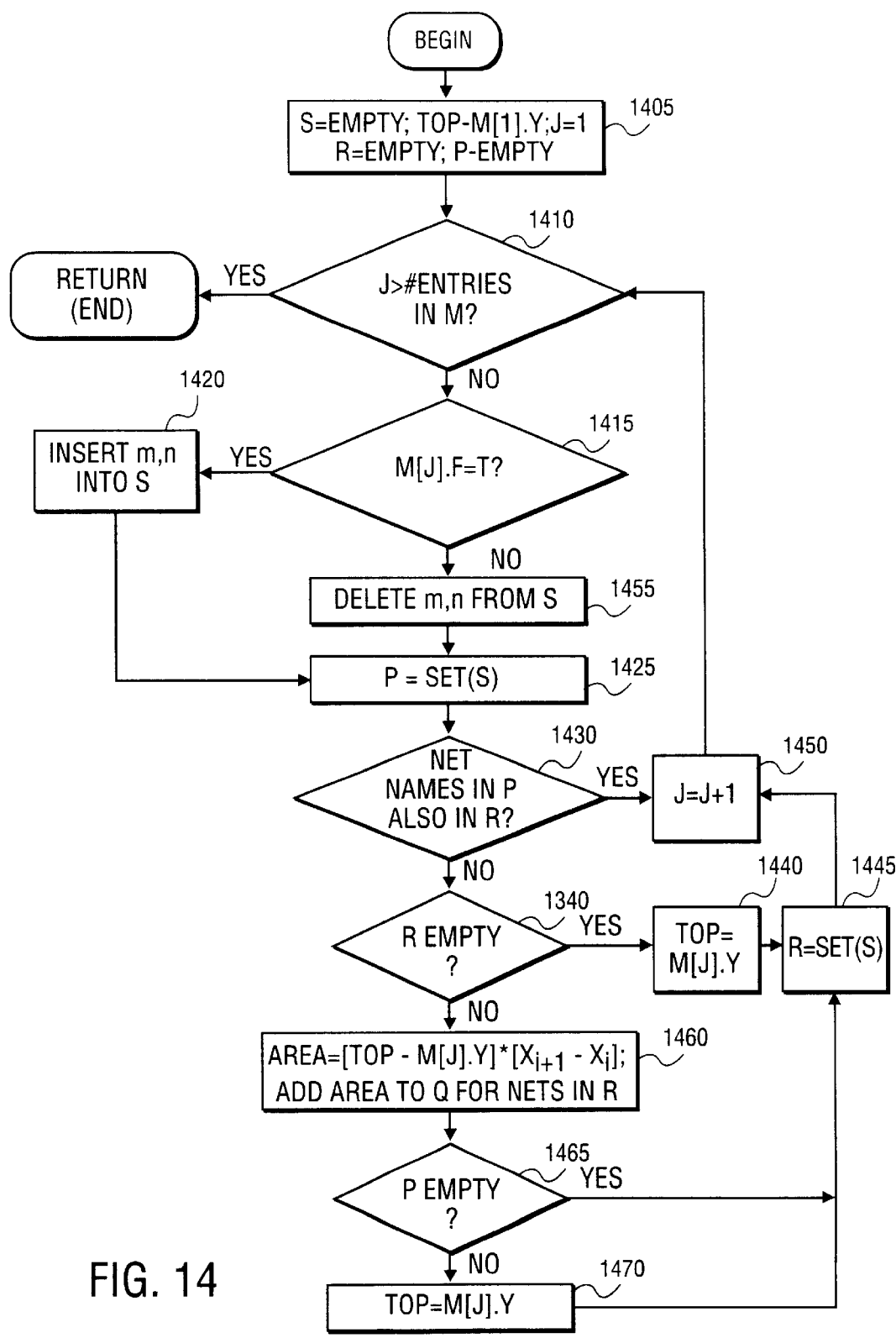
FIG. 14 is a flow diagram showing one embodiment of a method for updating a global list of bridges that may be used in the method of FIG. 13.
Figure 15A:
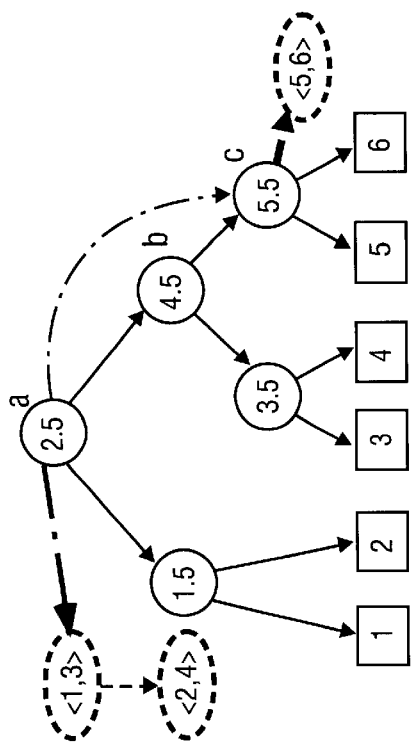
FIGS. 15a–d are diagrams showing a rectangle intersection approach of one embodiment.
Figure 15B:
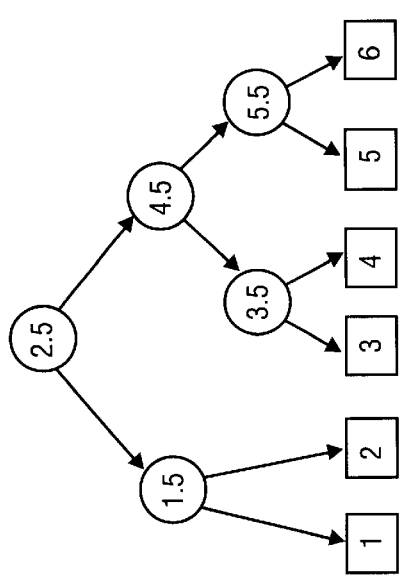
Figure 15C:
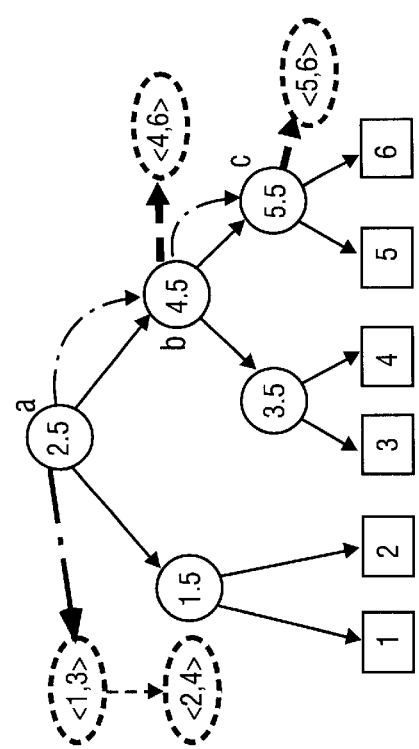
Figure 15D:
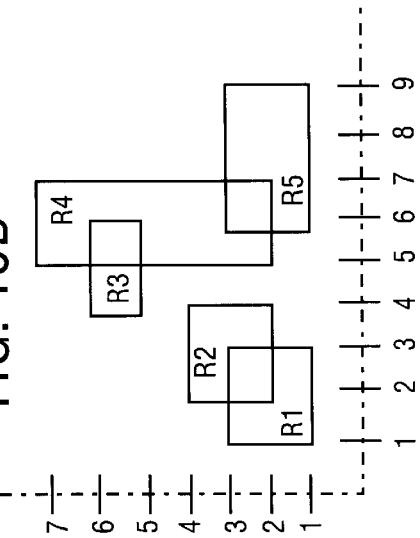

For purposes of illustration, exemplary overlapping overlap rectangles 1101–1105 for a particular defect size are shown in FIG. 11, which is referenced in the description corresponding to FIGS. 13 and 14. The rectangles 1101–1105 each have corner points at the X and Y coordinates shown in FIG. 11. While five overlap rectangles are shown in FIG. 11, it will be appreciated that the method described in reference to FIGS. 13 and 14 may be used to determine critical areas for a larger or smaller number of overlap rectangles.

FIG. 13 is a flow diagram showing a method of one embodiment for determining critical areas corresponding to two-net and multi-net bridges using a multi-net analysis mode. At block 1305, a list Q is initialized to be empty, a variable i is set to 1 and set M is an empty set. The list Q is a global list of two-net and/or multi-net bridges for which the critical area (or weighted critical area) is greater than 0 while the variable i is used as an index to indicate the particular X coordinate being evaluated. M is a list ordered by Y-coordinate value that is extracted from the ordered list L of 6-tuples. M indicates information regarding the active horizontal line segment(s) for particular X coordinate(s) as described in more detail below.

At decision block 1310, it is determined whether the variable i is less than the number of discrete X coordinate values in the ordered list L. For the example shown in FIG. 11, there are nine discrete X coordinates $X_1$–$X_9$. If i is less than the number of discrete X coordinates in L, then at decision block 1320 it is determined whether there are more 6-tuples in L having an X coordinate equal to $X_i$. If so, then at block 1325, the next 6-tuple having an X coordinate equal to $X_i$ is evaluated. For the list L shown in FIG. 11, for example, for i=1, the first 6-tuple in L having an X coordinate equal to $X_1$, is L[1]:<$X_1,Y_3$,I,B,M,N>.

At decision block 1330, if the "E" variable of the 6-tuple is equal to "I" or otherwise indicates an insert event, the Y coordinate value, the value of the "F" variable and the net-name pair of the 6-tuple are added to the set M at block 1335. For one embodiment, M is sorted in decreasing order by the Y coordinate value.

Referring again to the example in FIG. 11, the "E" variable of the 6-tuple L[1] is equal to "I" so <$Y_2$,B,M,N> of the 6-tuple is added to M as indicated under $X_1$. Following the same process starting at decision block 1320, <$Y_7$,T,M,N> of the 6-tuple L[2] is also added to M as shown in FIG. 11. When <$Y_7$,T,M,N> is added to M, it becomes the first entry M[1] because the value of the Y coordinate $Y_7$ is greater than the value of the Y coordinate $Y_3$ of the other entry in the list M.

It will be appreciated that, while FIG. 11 shows eight different lists M (one for each of the X coordinates $X_1$–$X_8$), for one embodiment, M is one list that is added to and subtracted from in the manner shown in FIG. 13. Each of the eight lists under the headings $X_1$–$X_8$ indicates the state of the list M after the entries in L corresponding to the indicated X coordinate have been evaluated in the manner shown in FIG. 13.

After the 6-tuple L[2] has been processed as described above, at decision block 1320, it is determined that there are no more 6-tuples in L with an X coordinate equal to $X_1$. Then, at block 1355, an update process is performed to determine incremental two-net and/or multi-net critical areas.

A method of one embodiment for determining the incremental, two-net and/or multi-net critical areas at block 1355 is illustrated in and described in reference to FIG. 14. At processing block 1405, sets S, R and P and variables TOP and J are initialized as indicated. S is a list of net names (possibly with duplication), P is the current set of net names and R is the previous set of net names. As above, the notations M[i].Y and M[i].F indicate the value of the Y coordinate and the value of the "F" variable, respectively, of the entry M[i] in the list M.

At decision block 1410, it is determined whether J is greater than the number of entries in M (number of entries in M is 2 for i=1 as shown in FIG. 11). If not, then at decision block 1415, it is determined whether M[J].F is equal to T or otherwise indicates the top of a rectangle. Referring to the list M for $X_1$ in FIG. 11, for example, where J=1, M[1].F is equal to T. Thus, processing continues at block 1420, where the net names indicated by the variables m and n in the 6-tuple (in the format <X,Y,E,F,m,n>) are added to the set S. For the current example, S then includes M and N as shown in FIG. 12. At block 1425, the set P is assigned the values of the set S and at decision block 1430, it is determined whether P and R include the same net-names. If they do not include the same net-names, then at decision block 1435, it is determined whether R is empty.

For the current example, S, and therefore, P, includes M and N while R is still empty. Thus, processing proceeds at block 1440 where TOP is assigned the value of M[J].Y, which, in this example, is $Y_7$. At block 1445, R is set to be equal to S and at block 1450, J is incremented.

The method then continues at decision block 1410 where is determined, for this example that J (now 2) is still not greater than the current number of entries in M. At block 1415, it is determined, for this example, that M[2].F equals B (or otherwise indicates the bottom of a rectangle). Processing therefore continues at block 855, where corresponding net names are deleted from S as shown in FIG. 12. At block 1425, P is set to equal S and at decision block 1430, it is determined that the net names in P are not the same as the net names in R. In this case, P is empty while R includes M and N. Thus, processing proceeds at block 860 where an incremental area is calculated. At block 860, AREA=[TOP−M[J].Y]*[$X_{i+1}$−$X_i$]. For this example, AREA=[$Y_7$−$Y_3$]*[$X_2$−$X_1$]. This area is added to the list Q for the nets in R. Thus, for this example, Q includes an entry for the net pair M,N with the AREA provided above. Because P is now empty (block 1465), processing proceeds at block 1445 where R=SET(S) and at block 1450 where J is incremented. At block 1410, it is determined that J is now greater than the current number of entries in M and processing returns to decision block 1355 in FIG. 13 where i is incremented.

For $X_2$, processing proceeds in a similar manner to adjust the list M in the manner shown in FIG. 11 under $X_2$. At block 1355, incremental areas are again calculated in the manner described above. Variables are initialized at block 1405 and at block 1410, it is determined that J is not greater than the number of entries in M. At block 1415, M[1].F equals T so M and N are inserted into S as shown in FIG. 12.

It will be noted in FIG. 12 that for J=2, M and N are again added to S such that there are duplicate entries for M and N in S. At decision block 1430, however, even though P includes two entries for M and N and R only includes one entry for M and N, they both include the same net names. Thus, processing proceeds at block 1450.

The incremental critical area for M and N is calculated at block 1460 when J=4. The AREA is determined to be [$Y_7$−$Y_1$]*[$X_3$−$X_2$]. This area is added to the critical area for the net-names in R which are M and N for this example. Thus, the list Q is updated to add the new area increment for M and N to the previous area increment calculated for M and N. Processing then returns again to FIG. 13, where i is again incremented.

For $X_3$, processing proceeds in a similar manner to adjust the list M as shown in FIG. 12 under $X_3$. The process of FIG.

14 is performed as described above such that the sets S, R and P are as shown in FIG. 12 at each of the different values for J. At decision block 1430, when J=2, for example, it is determined that P and R do not include the same net-names and at decision block 1435, it is determined that R is not empty. Thus, at block 1460, an area calculation is performed as described above and the incremental critical area is added to the critical area for the particular net-names in R (in this case, M and N again).

When the AREA calculation is finished, however, it is determined at processing block 1465 that P is not empty. Thus, at block 1470, TOP is updated to equal M[J].Y—in this case, M[2].Y=$Y_5$. Processing continues at block 1445 where R gets the values in S and at block 1450, J is incremented.

Since, at block 1410, J is still less than the number of entries in M (J=3 and M includes 6 entries at $X_3$), processing continues as described above such that S, P and R are added to and subtracted from in the manner shown in FIG. 12. For J=5, as shown in FIG. 12, it is determined at block 1430, that the net-names in P are not the same as the net-names in R and at block 1435, that R is not empty. Thus, at block 1460, another incremental critical area is calculated in a similar manner. This time, however, the incremental critical area is associated with a multi-net bridge as shown by the entries in R: M, N and P. Thus, an entry is added to Q for M,N and P along with the incremental critical area calculated at block 1460. For X3, it will be noted that another incremental critical area for the nets M and N is calculated for J=6.

Processing continues in the above-described manner for each discrete X coordinate associated with an identified overlap rectangle with the exception of the rightmost X coordinate. As shown in FIG. 13, once i is incremented to equal the number of discrete X coordinates in L, the process ends.

It should be noted that the method for calculating incremental critical areas illustrated in FIGS. 13 and 14 and described above also takes into account empty spaces between overlap rectangles such that they are subtracted from the critical area calculations. This can be seen when performing the methods of FIGS. 13 and 14 for $X_5$, for example.

Referring back to FIG. 10, once incremental critical areas have been calculated at block 1050 in the above manner for all overlap rectangles defined in blocks 1025 and 1030, then at block 1055, corresponding weighted critical areas are updated using defect data corresponding to the particular defect size being evaluated.

At decision block 1060, if there are more defect sizes to be evaluated, than at block 1040, the next defect size is selected and processing proceeds as described above. At block 1060, if all defect sizes have been evaluated, then at block 1070, it is determined whether there are more layers or layer-pairs to be analyzed. If so, processing proceeds at block 1010 as described above. If not, then at block 1075, two-net and/or multi-net bridges are sorted by weighted critical area and at block 1080, a list of two-net and/or multi-net bridges ordered by WCA is provided as output data.

The ordered lists provided by the above approaches may be used to target and prioritize manufacturing tests to achieve a desired balance of test coverage versus test time, for example. Such a capability may be particularly important as some companies begin to move from functional testing towards structural testing.

Using the above-described approaches, processor execution time may be reduced as compared to prior fault extraction programs by calculating maximum overlap rectangles (or critical areas) first and determining overlap rectangles (or critical areas) for smaller defect sizes by reducing the maximum overlap rectangles (critical areas) in the manner described above. Further, local merging of critical areas in a two-net analysis mode may also improve efficiency by bucketing all critical areas associated with a net-name pair together such that overlapping critical areas can be easily identified and processed.

Due to this improved efficiency, it may be possible in some cases to perform bridge fault extraction for a larger number of defect sizes in a smaller amount of time. By using a larger number of defect sizes, the list of weighted critical areas provided by the WCA calculator 159, for example, may more closely approximate a continuous distribution of defect sizes and therefore, may be more accurate. This improved efficiency may also provide the capability to analyze larger layouts in a shorter amount of time.

These improvements in efficiency (particularly where there are fewer calculations) may also help in terms of the storage space needed on a server to perform the likely bridge fault extraction. Thus, it may be possible in some cases to analyze a larger integrated circuit layout without running out of space on the host computer system as compared to prior bridge fault extraction approaches.

Additionally, by using the above-described approach of calculating overlap rectangles (critical areas) for smaller defect sizes from the maximum overlap rectangles (critical areas) and then calculating the area of a union of critical areas based on the resized critical areas for the two-net analysis mode, embodiments of the invention strike a balance between performance and accuracy concerns. For the multi-net analysis mode, by determining the critical areas associated with multiple nets, accuracy may be further improved.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A computer-implemented method comprising:
   determining overlap rectangles from an integrated circuit layout for a defect size of a set of defect sizes to be analyzed, each overlap rectangle corresponding to a net-name pair;
   sorting the overlap rectangles by location in the layout; and
   determining critical areas corresponding to multi-net bridges based on the sorted overlap rectangles for the net-name pairs.

2. The method of claim 1 wherein nets in the layout are specified as a plurality of rectangles each with a corresponding net-name, and wherein determining overlap rectangles corresponding to net-name pairs for a maximum defect size of the set of defect sizes includes
   expanding each rectangle on all sides by a radius of the maximum defect size; and
   identifying areas of overlap of the expanded rectangles as overlap rectangles.

3. The method of claim 2 wherein determining overlap rectangles corresponding to net-name pairs for each defect size smaller than the maximum defect size includes:

reducing each maximum overlap rectangle by a radius of the selected defect size on all sides of the maximum overlap rectangle.

4. The method of claim 3 wherein determining overlap rectangles corresponding to net-name pairs of each defect size smaller than the maximum defect size includes:

reducing each overlap rectangle for a next largest defect size by a radius of the selected defect size on all sides of the overlap rectangle for the next largest defect size.

5. The method of claim 1 wherein sorting the overlap rectangles and determining the critical areas further includes:

identifying X and Y coordinates for corner points of each overlap rectangle corresponding to a net-name pair;

for each defect size in the set of defect sizes, ordering corner points of corresponding overlap rectangles by X coordinate value; and using the ordered corner points to compute the critical areas corresponding to multi-net bridges.

6. The method of claim 5 further including:

indicating for each corner point a relative position of the corner point in the corresponding rectangle;

indicating for each corner point whether the corner point corresponds to an insert event or a delete event;

indicating for each corner point the corresponding net-name pair; and using the indications of relative position, net-name pair and insert or delete events in computing the critical areas corresponding to multi-net bridges.

7. A computer-implemented method comprising:

ordering a first list of corner points of overlap rectangles corresponding to net-name pairs by X coordinate values;

for each different X coordinate value in the first list, computing a corresponding partial critical area; and accumulating the partial critical areas by net-name groups.

8. The method of claim 7 further including:

for each corner point in the first list,
  indicating whether the corner point is a top or bottom corner point of a corresponding overlap rectangle;
  indicating whether an insert event or a delete event is associated with the corner point; and
  indicating a net-name pair with which the corner point is associated.

9. The method of claim 8 further including:

for each different X coordinate value in the first list
  for each entry in the first list having the selected X coordinate value
    adding a corresponding Y coordinate value, top or bottom indication and net-names to a second list if an insert event is indicated; and
    deleting a corresponding Y coordinate value, top or bottom indication and net-names from the second list if a delete event is indicated.

10. The method of claim 9 further comprising:

for each entry in the second list having a top indication, inserting the corresponding net-names into a third list; and for each entry in the second list having a bottom indication, deleting the corresponding net-names from the third list.

11. The method of claim 10 wherein accumulating comprises:

after each insertion into and deletion from the third list, determining whether the net-names in the third list after the insertion or deletion are the same as the net-names in the third list prior to the insertion or deletion;

if they are not the same, and the third list prior to the insertion or deletion was not empty, calculating an incremental critical area corresponding to the net-names in the third list prior to the insertion or deletion; and adding the incremental critical area to the net-name pair group critical area.

12. The method of claim 11 further comprising weighting the critical areas according to defect data.

13. The method of claim 5 wherein using the ordered corner points to compute the critical areas corresponding to multi-net bridges includes subtracting out open spaces between multiple overlapping overlap rectangles.

14. The method of claim 7 wherein accumulating the partial critical areas by net-name groups includes subtracting out open spaces between multiple partial critical areas.

15. A machine-accessible storage medium storing instructions which, when executed by a processor in a computer system, perform fault extraction on an integrated circuit layout including:

determining overlap rectangles from an integrated circuit layout for a defect size of a set of defect sizes to be analyzed, each overlap rectangle corresponding to a net-name pair;

ordering the overlap rectangles by a corner coordinate; and determining critical areas corresponding to multi-net bridges based on the overlap rectangles for the net-name pairs.

16. The computer-accessible storage medium of claim 15 wherein nets in the layout are specified as a plurality of rectangles each with a corresponding net-name, and wherein determining overlap rectangles corresponding to net-name pairs for a maximum defect size of the set of defect sizes includes expanding each rectangle on all sides by a radius of the maximum defect size; and identifying areas of overlap of the expanded rectangles as overlap rectangles.

17. The computer-accessible storage medium of claim 16 wherein determining overlap rectangles corresponding to net-name pairs for each defect size smaller than the maximum defect size includes:

reducing each maximum overlap rectangle by a radius of the selected defect size on all sides of the maximum overlap rectangle.

18. The computer-accessible storage medium of claim 17 wherein determining overlap rectangles corresponding to net-name pairs of each defect size smaller than the maximum defect size includes:

reducing each overlap rectangle for a next largest defect size by a radius of the selected defect size on all sides of the overlap rectangle for the next largest defect size.

19. The computer-accessible storage medium of claim 15 wherein ordering overlap rectangles by corner coordinates and determining critical areas further includes:

identifying X and Y coordinates for corner points of each overlap rectangle corresponding to a net-name pair;

for each defect size in the set of defect sizes, ordering corner points of corresponding overlap rectangles by X coordinate value; and using the ordered corner points to compute the critical areas corresponding to multi-net bridges.

20. The computer-accessible storage medium of claim 19 storing instructions which, when executed by a processor in a computer system perform fault extraction on an integrated circuit layout further including:

indicating for each corner point a relative position of the corner point in the corresponding rectangle;

indicating for each corner point whether the corner point corresponds to an insert event or a delete event;

indicating for each corner point the corresponding net-name pair; and using the indications of relative position, net-name pair and insert or delete events in computing the critical areas corresponding to multi-net bridges.

21. An article of manufacture comprising a machine-accessible medium including data that, when accessed by a machine, cause the machine to:

order a first list of corner points of overlap rectangles corresponding to net-name pairs by X coordinate values;

for each different X coordinate value in the first list, compute a corresponding partial critical area; and accumulate the partial critical areas by net-name groups.

22. The article of manufacture of claim 21 wherein the machine-accessible medium further includes data that causes the machine to:

for each corner point in the first list,
indicate whether the corner point is a top or bottom corner point of a corresponding overlap rectangle;
indicate whether an insert event or a delete event is associated with the corner point; and
indicate a net-name pair with which the corner point is associated.

23. The article of manufacture of claim 22 wherein the machine-accessible medium further includes data that causes the machine to:

for each different X coordinate value in the first list
for each entry in the first list having the selected X coordinate value add a corresponding Y coordinate value, top or bottom
indication and net-names to a second list if an insert event is indicated; and
delete a corresponding Y coordinate value, top or bottom indication and net-names from the second list if a delete event is indicated.

24. The article of manufacture of claim 23 wherein the machine-accessible medium further includes data that causes the machine to:

for each entry in the second list having a top indication, insert the corresponding net-names into a third list; and for each entry in the second list having a bottom indication, delete the corresponding net-names from the third list.

25. The article of manufacture of claim 24 wherein the machine-accessible medium further includes data that causes the machine to:

after each insertion into and deletion from the third list, determine whether the net-names in the third list after the insertion or deletion are the same as the net-names in the third list prior to the insertion or deletion;

if they are not the same, and the third list prior to the insertion or deletion was not empty, calculate an incremental critical area corresponding to the net-names in the third list prior to the insertion or deletion; and add the incremental critical area to the net-name pair group critical area.

26. The article of manufacture of claim 25 wherein the machine-accessible medium further includes data that causes the machine to:

weight the critical areas according to defect data.

* * * * *

UNITED STATES PATENT AND TRADEMARK OFFICE
CERTIFICATE OF CORRECTION

PATENT NO.    : 6,519,499 B1
DATED         : February 11, 2003
INVENTOR(S)   : Chakravarty et al.

It is certified that error appears in the above-identified patent and that said Letters Patent is hereby corrected as shown below:

Column 4,
Line 47, delete "comer", insert -- corner --

Column 7,
Lines 2 and 10, delete "comer", insert -- corner --.

Signed and Sealed this

Tenth Day of June, 2003

JAMES E. ROGAN
*Director of the United States Patent and Trademark Office*